United States Patent [19]
Maruyama et al.

[11] Patent Number: 6,001,175
[45] Date of Patent: Dec. 14, 1999

[54] CRYSTAL PRODUCING METHOD AND APPARATUS THEREFOR

[76] Inventors: Mitsuhiro Maruyama; Yasuhiro Maruyama, both of 44-29, Wada 1-chome, Suginami-ku, Tokyo 166, Japan

[21] Appl. No.: 08/610,296

[22] Filed: Mar. 4, 1996

[30] Foreign Application Priority Data

Mar. 3, 1995 [JP] Japan .................................... 7-044387

[51] Int. Cl.$^6$ .................................................. C30B 25/14
[52] U.S. Cl. ............................ 117/102; 117/93; 117/201; 118/725
[58] Field of Search ............................ 117/102, 93, 201; 118/725

[56] References Cited

U.S. PATENT DOCUMENTS

| | | | |
|---|---|---|---|
| 3,008,447 | 11/1961 | Lacroix | 118/725 |
| 3,381,114 | 4/1968 | Nakanuma | 118/725 |
| 3,627,590 | 12/1971 | Mammel | 117/901 |
| 5,155,062 | 10/1992 | Coleman | 117/901 |
| 5,186,756 | 2/1993 | Benko et al. | 118/725 |
| 5,320,680 | 6/1994 | Learn et al. | 118/725 |
| 5,715,361 | 2/1998 | Moslehi | 118/725 |

*Primary Examiner*—Robert Kunemund
*Attorney, Agent, or Firm*—Evenson, McKeown, Edwards & Lenahan, PLLC

[57] ABSTRACT

A method and apparatus of producing a crystal by using of vapor growth process, wherein: a high-frequency coil or conductor having a coil or conductor surface to generate a plane-like induction electric field is arranged so that at least one gas blowout port is connected to the coil or conductor surface so as to face a solid substrate; and a component element or a chemical compound is continuously precipitated and grown on a surface of the solid substrate at a temperature of not higher than the melting point of the solid substrate while the solid substrate is inductively heated by the high-frequency coil or conductor and a raw gas is supplied onto the surface of the solid substrate through the gas blowout port, to thereby produce a polycrystal or monocrystal thin film.

15 Claims, 27 Drawing Sheets

CRYSTAL PRODUCING METHOD AND APPARATUS THEREFOR

BACKGROUND OF THE INVENTION

1. Field of the Invention

The present invention generally relates to crystal producing method and apparatus, and particularly relates to a method and apparatus for producing a crystal or thin film by using vapor growth reaction, and particularly to such a method and apparatus, in which a substrate or wafer is induction-heated directly or indirectly by using a high-frequency coil having gas blowout ports arranged so as to face a surface of the substrate in a reaction chamber under the condition of reduced or ordinary pressure and, at the same time, a reactive gas or a raw gas is supplied through the gas blowout ports so as to chemically etch the surface of the substrate or wafer, or so as to precipitate monocrystal, polycrystal or amorphous solids (semiconductors, oxides, nitrides, metals, alloys, or other compounds of silicon).

2. Description of the Related Art

In recent years, semiconductor wafers, especially silicon wafer substrates, have been used popularly for solar cells; discrete semiconductor devices such as transistors, diodes, etc.; ICs (Integrated Circuits), and ULSIs (Ultra Large Scale Integrated Circuits).

A large number of processing techniques are used for producing those devices on substrate wafers. Among the techniques, a CVD (Chemical Vapor Deposition method), etching (chemical etching), and heat-treatment (annealing) method in an inert gas are used as processes using vapor phase reaction. For example, there is used an epitaxial growth (thin-film monocrystal growth) method under ordinary or reduced pressure, formation of various kinds of thin films such as an oxide film, a nitride film, a polycrystal silicon film, a metal thin film, etc., by the CVD method, high-temperature etching using a hydrochloric acid gas, or the like.

With the increase of density and integration of devices and the increase of size (to 12–16"φ) of substrate crystals, demands on improvement of substrate material quality and accuracy have become severe, so that great reduction of material and equipment cost attended with improvement of accuracy in machining processes and mass-production has become more and more important.

Prior to the description of the present invention, a silicon epitaxial growth apparatus will be described as an example of the process of this type.

FIG. 22 is a view showing a conventional producing apparatus for vertical silicon epitaxial crystal growth using high-frequency heating. Referring to FIG. 22, the process of crystal growth will be described below. In FIG. 22, the reference numeral 1 designates a high-frequency coil; 5, a raw gas introduction pipe; 7, gas diffusion holes provided at an end of the introduction pipe 5; 8, a silicon monocrystal substrate; 9, a carbon susceptor having a shape like a doughnut type disk; 11, a carbon susceptor support; 33, a bell jar to form a reaction chamber; 34, an exhaust gas outlet; and 35, a coil cover made of quartz.

In FIG. 22, the silicon substrate 8 is arranged on the carbon susceptor 9 and heated indirectly by heat conduction through the carbon susceptor 9 heated by the high-frequency coil 1. The heating temperature is generally in a range of from 900° C. to 1200° C. The carbon susceptor 9 is arranged on the support 11 and rotated to make the temperature distribution uniform. In this state, a raw gas is introduced, through the raw gas introduction pipe 5 in the center, into a container which is constituted by the bell jar 33 to form a reaction chamber. The raw gas is then blown out from the gas diffusion holes 7. Examples of the raw gas are monosilane ($SiH_4/H_2$), dichlorsilane ($SiH_2Cl_2/H_2$), trichlorsilane ($SiHCl_3/H_2$), tetrachlorsilane ($SiCl_4/H_2$), etc. Hydrogen is used as a transport gas.

The raw gas blown out through the gas diffusion holes 7 partly reaches the surface of the heated silicon substrate 8 and is subjected to heat decomposition or reducing reaction, so that silicon is precipitated and epitaxially grown as a monocrystal on the surface of the substrate. In this occasion, impurities (P type: $B_2Cl_4$, N type: $PH_2$, $AsH_3$) are supplied to the raw gas so that resistivity in the growth layer is adjusted. Although part of the raw gas is precipitated on the surface of the substrate, other raw materials are precipitated on the susceptor 9 and on the wall of the container and the residual part of the raw gas as an unreacted part is ejected out of the container through the exhaust gas outlet 34.

Although FIG. 22 shows the case where a method using high-frequency induction heating is used as the method of heating the substrate 8, there may be used a heating method using a resistor as a heating source, a heating method using an infrared lamp as a heating source, and so on.

In the epitaxial growth method according to the aforementioned prior art, not only the loss of electric power is large because a large-scale susceptor having a volume several hundred times as large as the volume of the wafers which are silicon substrates is heated, but also the utilization rate of the raw gas to be used effectively as an epitaxial layer on the wafers is very low because the raw gas supplied is circulated in the apparatus. The utilization rate is only several percents by weight of a raw material. Most of component gases are polycrystallized and precipitated on the substrate support (susceptor) and on the wall of the container or ejected out of a system as unreacted gases.

Furthermore, in the aforementioned prior art, the growth speed of the epitaxial growth layer depends on a diffusion rate determining layer in the surface of the wafers, so that, generally, the growth speed is in a range of from about 0.5 $\mu$m/min to about 3 to about 3 $\mu$m/min and cannot be selected to be so higher. In addition, the impurities (boron, arsenic, phosphorus, antimony, etc.) added into the substrate wafer are gasified so as go round from the rear surface to the front surface, so that the impurities are incorporated into the epitaxial growth layer again. As a result, auto-doping occurs to make it difficult to control the distribution of impurities between the epitaxial layer of the epitaxial wafer and the substrate wafer and the resistivity in the epitaxial layer.

In the high-frequency heating method or in the resistance heating method, the gradient of heat in the wafers is large so that distortion due to heat stress easily causes sliding or slipping (crystal defects) of crystal faces in the crystal of the wafers, because the heat of the susceptor is transmitted to the wafers by heat conduction. Furthermore, because the size of the susceptor is large so that the heat capacity is large, a large time is required for changing the temperature to thereby cause lowering of throughput (the number of times of growth per time). Furthermore, not only the size of the apparatus is made large but also the susceptor and the quartz-containing bell jar are made expensive.

In the infrared lamp heating method, distortion due to the gradient of heat in the wafers is small so that slipping little occurs, because the wafers are directly heated. The method, however, has disadvantages in the short life (large consumption) of the lamp and the complex structure of the lamp house. In addition, the method has disadvantages in the large loss of electric power because of the necessity of heating the large-scale cylinder type susceptor, the complex maintenance of the apparatus, and so on.

On the other hand, the diameter of the wafers has been increased greater and greater. The diameter which was conventionally in a range of from 150 mm to 200 mm has a tendency to increase so that wafers having a diameter in a range of from 300 mm to 400 mm will be made the main current in the future. Accordingly, a sheet type apparatus has been made the main current because the size becomes large in the conventional batch type apparatus.

SUMMARY OF THE INVENTION

An object of the present invention is to solve the aforementioned problems in the prior art, that is, to provide a method and apparatus for producing a crystal or thin film by vapor phase reaction to thereby make it possible to use the raw gas effectively, increase the growth speed, heat the wafer directly, reduce the size of the reactor, simplify the reactor, decrease the reaction temperature and save energy.

In order to attain the above objects, according to an aspect of the present invention, in the method of producing a crystal by using of vapor growth process: a high-frequency coil or conductor having a coil or conductor surface to generate a plane-like induction electric field is arranged so that at least one gas blowout port is connected to the coil or conductor surface so as to face a solid substrate; and a component element or a chemical compound is continuously precipitated and grown on a surface of the solid substrate at a temperature of not higher than the melting point of the solid substrate while the solid substrate is inductively heated by the high-frequency coil or conductor and a raw gas is supplied onto the surface of the solid substrate through the gas blowout port, to thereby produce a polycrystal or monocrystal thin film.

According to another aspect of the present invention, in the method of producing a crystal by using a vapor growth process: a high-frequency coil or conductor having a coil or conductor surface to generate a plane-like induction electric field is arranged so that at least one gas blowout port is connected to the coil or conductor surface so as to face a solid substrate; and removal of a surface portion of the solid substrate by chemical etching or heat treatment on the solid substrate is performed at a temperature of not higher than the melting point of the solid substrate while the solid substrate is inductively heated by the high-frequency coil or conductor and while a corrosive gas, a reducing gas, an oxidizing gas or a neutral gas is supplied onto the surface of the solid substrate through the gas blowout port, to thereby produce a polycrystal or monocrystal substrate.

According to a further aspect of the present invention, the apparatus for producing a crystal by using a vapor growth process, comprises: means for retaining a solid substrate; a high-frequency coil or conductor having a coil or conductor surface to generate a plane-like induction electric field and being arranged so that at least one gas blowout port is connected to the coil or conductor surface so as to face the solid substrate; means for cooling the high-frequency coil or conductor; means for inductively heating the solid substrate by the high-frequency coil or conductor; and means for supplying a raw gas onto a surface of the solid substrate through the gas blowout port to thereby produce a polycrystal or monocrystal thin film.

According to a still further aspect of the present invention, the apparatus for producing a crystal by using a vapor growth process, comprises: means for retaining a solid substrate; a high-frequency coil or conductor having a coil or conductor surface to generate a plane-like induction electric field and being arranged so that at least one gas blowout port is connected to the coil or conductor surface so as to face the solid substrate; means for cooling the high-frequency coil or conductor; means for inductively heating the solid substrate by the high-frequency coil or conductor; and means for supplying a corrosive gas, a reducing gas, an oxidizing gas or a neutral gas onto a surface of the solid substrate through the gas blowout port to thereby produce a polycrystal or monocrystal substrate.

In the above apparatus, preferably, the at least one blowout port is formed in the high-frequency coil or conductor so as to face the surface of the solid substrate.

In the above apparatus, preferably, the at least one gas blowout port is formed in at least one of opposite surfaces of the high-frequency coil or conductor so that at least one kind of various of gases is sprayed toward the surface of the solid substrate.

In the above apparatus, preferably, the direction of gas blowout of the at least one gas blowout port of the high-frequency coil or conductor is perpendicular to the surface of the solid substrate or has an inclination angle with respect to the surface of the solid substrate.

In the above apparatus, preferably, the high-frequency coil or conductor is made of gold, silver, copper, aluminum, or plating of gold, silver, copper, or aluminum; and the coil or conductor surface where the at least one gas blowout port is formed is a mirror surface.

In the above apparatus, preferably, the solid substrate is disposed one the surface of the high-frequency coil or conductor where the at least one gas blowout port is formed so that solid substrate is rotated or moved while the solid substrate is retained in a levitated state in which the solid substrate is levitated by a levitation force due to the gas blowout and by a levitation force due to a high-frequency induction repulsion by the high-frequency coil or conductor.

Preferably, the above apparatus further comprises: at least one optical path constituted by a hole or a transparent solid material and arranged so as to pierce the surface of the high-frequency coil or conductor, and means for radiating long wavelength light-rays (infrared rays) through the optical path to thereby heat the solid substrate.

Preferably, the above apparatus further comprises: at least one optical path constituted by a hole or a transparent solid material and arranged so as to pierce the surface of the high-frequency coil or conductor; and means for radiating short wavelength light-rays (violet rays) through the optical path.

Preferably, the above apparatus further comprises: at least one optical path constituted by a hole or a transparent solid material and arranged so as to pierce the surface of the high-frequency coil or conductor; means for detecting the surface temperature of the solid substrate through the optical path to thereby generate a detection output signal; and means for receiving the detection output signal through a feedback circuit and for adjusting an output power of a high-frequency electric source to thereby regulate the temperature of the solid substrate.

As the prior art in which gas blowout ports (nozzles) are connected to an annular induction heating coil, a method in which doping is performed in a manner so that a dope material sprayed toward a floating zone melt in the center portion of the coil and the dope material is absorbed to the floating zone melt in order to produce a bulk silicon rod by using a floating zone melting method is known as disclosed in Japanese Patent Unexamined Publication No. Sho-46-5425, Japanese Patent Postexamination Publication No. Sho-60-46072, etc.

On the contrary, the present invention is applied to a plane-like solid substrate and carried out at a temperature not higher than the melting point of the substrate for the following purposes. The solid substrate is disposed in parallel to a conductor surface or coil surface constituting a plane-like induction electric field. A raw gas, an etching gas or an inert gas is sprayed onto the surface of the solid substrate through gas blowout ports connected to the conductor surface or coil surface and, at the same time, induction heating is performed so that epitaxial growth or thin-film growth is performed by a vapor phase growth method. Furthermore, the solid substrate is subjected to heat treatment (annealing), or the like. Accordingly, the present invention is quite different, in the structure, operation, purpose and effect, from the techniques disclosed in the aforementioned publications.

The operation of the present invention based on the aforementioned configuration will be described.

In the conventional epitaxial growth apparatus (mainly using high-frequency heating or electrical resistance heating method), substrate wafers are heated indirectly by heat conduction by using a large-scale susceptor. Therefore, not only consumed electric power is large but also cycle time becomes long (throughput is lowered) because of the heat capacity. Furthermore, the temperature gradient in the substrate wafer and between susceptors becomes large, so that crystal defects such as slipping, etc., are apt to occur in the inside of the substrate.

In the method according to the present invention, on the contrary, wafers are heated directly by high-frequency induction, so that consumed electric power can be reduced to a very small value. Further, the susceptor is constituted by a mere support. Accordingly, the heat gradient in the substrate wafer is small, so that the occurrence of slipping can be suppressed greatly. The time required for temperature rise/fall can be reduced greatly by the rapid heating and rapid cooling which is performed by using an inert gas after the reaction, so that an improvement of the throughput can be attained. Furthermore, the size of the apparatus can be reduced, so that the consumption of expensive quartz parts, susceptors, etc. can be reduced.

In the conventional apparatus, as the reaction chamber, a bell jar type chamber (made of quartz or stainless steel) or a cylinder type chamber (made of quartz) is used so that a gas is supplied to the susceptor horizontally or vertically through a long distance and only a part of the gas reaches the surface of the substrate wafer so as to be supplied to the substrate wafer while the gas is circulated in the reaction chamber by convection. Accordingly, in the prior art, the composition of the component gas is apt to change correspondingly to the relative position, so that the thickness and resistivity of the product vary greatly. Furthermore, a large part of the reaction gas is precipitated on the susceptors supporting no substrate wafer and on the high-temperature wall of the reaction chamber or ejected together with exhaust gas out of the reaction chamber. Accordingly, the efficiency of utilization of the raw gas is so poor that it is generally the that the efficiency of utilization is several percents. Furthermore, the effective supply rate and concentration of the raw gas in the neighborhood of the substrate wafer surface are not greatly increased, so that the reaction rate is determined on the basis of diffusion in the surface boundary layer. Accordingly, the growth speed of the epitaxial layer cannot be increased and, generally, it is only in a range of about 1 $\mu$m/min to about 3 $\mu$m/min.

In the present invention, on the contrary, a water-cooled high-frequency coil surface is disposed very near a substrate wafer (the distance between the substrate wafer and the coil surface is in a range of from 5 mm to 30 mm) so that a raw gas or a reactive gas is sprayed directly from gas blowout ports provided in the coil surface so that a large part of reaction can be carried out on the substrate wafer. Accordingly, the percentage of utilization of the supplied gas can be improved greatly (not smaller than 10%). Furthermore, a uniform concentration of the gas is supplied while rotating in a very close range perpendicularly to the substrate wafer or obliquely at an inclination angle with respect to the substrate wafer, there is no change (gradient) of the supply gas composition corresponding to the relative position of the substrate. Furthermore, the effective flow rate on the surface of the substrate wafer can be increased, and the boundary layer becomes small, so that the reaction rate is determined depending on the surface and the growth speed and the evenness of the thickness of the growth film can be improved.

Furthermore, in the conventional apparatus, because the reaction product gas and the supplied raw gas are circulated in the reaction chamber by convection, a high concentration of impurities (such as boron, arsenic, phosphorus, antimony, etc.) in the substrate wafer is gasified by chemical etching or substrate outward diffusion so that the impurity gas is mixed into the raw gas and incorporated into the growth layer again. Accordingly, a so-called auto-doping phenomenon occurs to make it difficult to adjust the distribution of the impurities in the interface between the substrate and the epitaxial growth layer. As a countermeasure, in the prior art, the rear surface of the substrate is coated with a silicon oxide film or a silicon nitride film.

According to the present invention, on the contrary, only a raw gas is supplied to a substrate wafer so as to flow toward the periphery (outside) of the substrate wafer. Accordingly, no product gas is mixed from the rear surface of the substrate into the raw gas. That is, auto-doping does not occur, so that it is not necessary to coat the rear surface with an oxide film or a nitride film. Furthermore, because the replacement of the product gas can be made speedily, horizontal auto-doping in a surface burying region can be also improved greatly.

Incidentally, surface burying is a process used in a bipolar I/C, in which a high-concentration doping region for element separation or for collector connection is partially formed in the surface of the substrate in advance so that the epitaxial layer is made to grow on the high-concentration doping region. In the epitaxial growth, impurity gases are produced to cause the horizontal re-distribution of impurities to thereby deteriorate the characteristic of elements.

Furthermore, according to the present invention, a coil surface having gas blowout ports may be disposed in the upper side, and the front surface side of the substrate wafer is disposed above the coil surface so as to be opposite thereto, so that the substrate wafer is directly heated by high-frequency induction. At the same time, the substrate wafer can be floated and held in the air above the coil by a floating force based on a levitation effect and by a floating force of a gas (raw gas, reactive gas, inert gas, etc.) based on gas spraying. Accordingly, loading/unloading of the substrate wafer can be performed smoothly without being subjected to contamination from the susceptor, or the like.

Furthermore, according to the present invention, an optical path (pipe) made of a transparent solid for guiding light energy (infrared rays, ultraviolet rays) may be provided so as to pass through the coil surface, so that initial induction heating (infrared rays), reduction of reaction temperature and acceleration of a specific reaction (ultraviolet rays) can be attained. Furthermore, the present invention has many advantages, for example, that automatic temperature adjustment can be performed on the basis of radiation thermometry and high-frequency oscillator output adjustment by using light radiated from the substrate wafer through the optical path at a high temperature, and so on.

DESCRIPTION OF THE PREFERRED EMBODIMENTS

Embodiments of the crystal producing method and apparatus using vapor phase reaction according to the present invention will be described below with reference to the drawings.

Figure 13A:
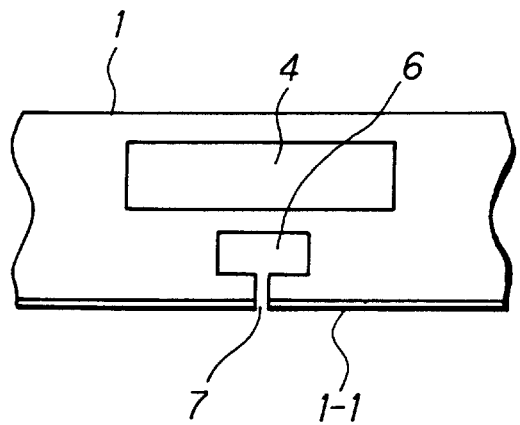
FIGS. 13A to 13N are views showing examples of the structure and arrangement of gas blowout ports and a high-frequency coil for explaining main part of a producing apparatus used in the aforementioned embodiments of the present invention.
Figure 13N:
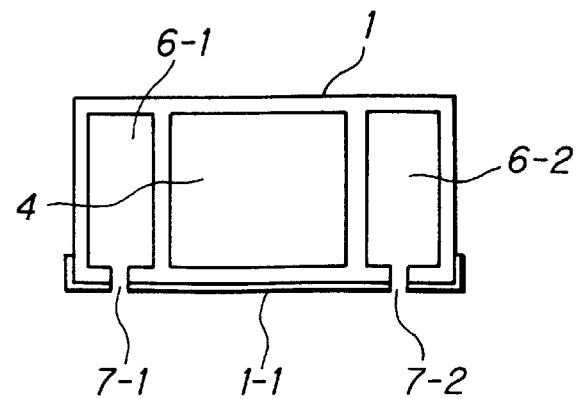
Figure 14:
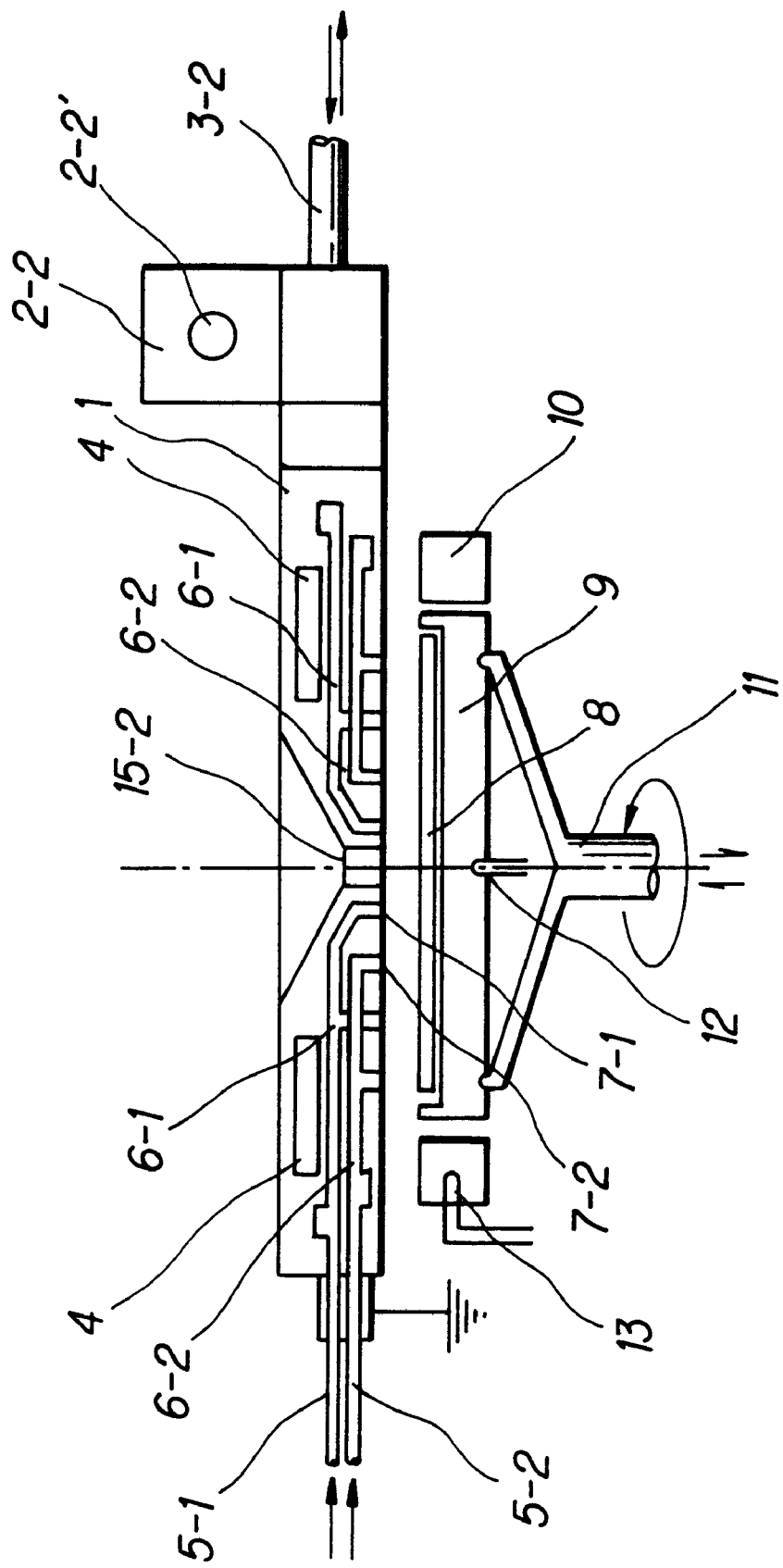
FIG. 14 is a sectional structural side view of main part of a producing apparatus for explaining a further embodiment of the present invention.
Figure 15:
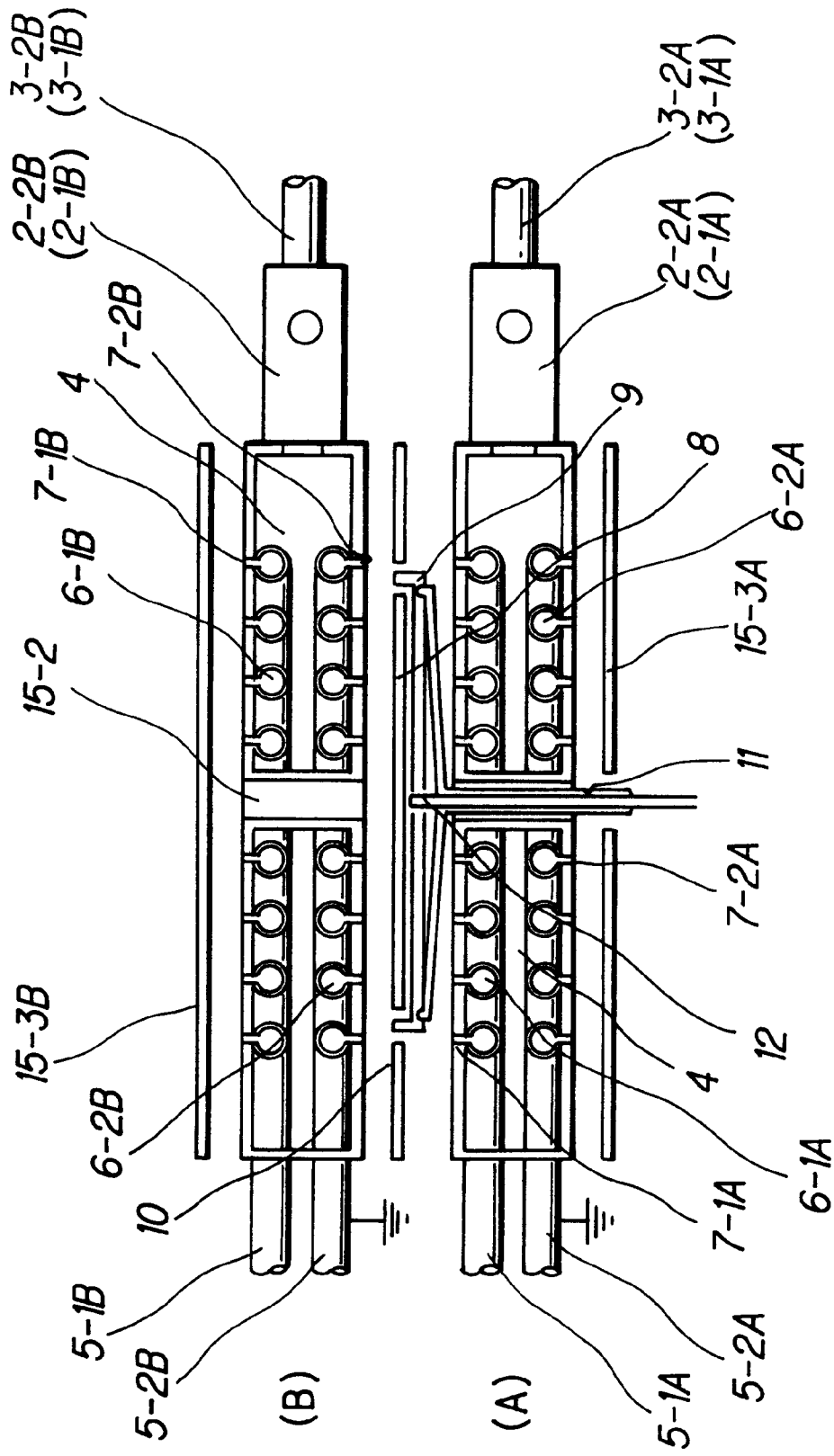
FIG. 15 is a sectional structural side view of main part of a producing apparatus for explaining another embodiment of the present invention.
Figure 16:
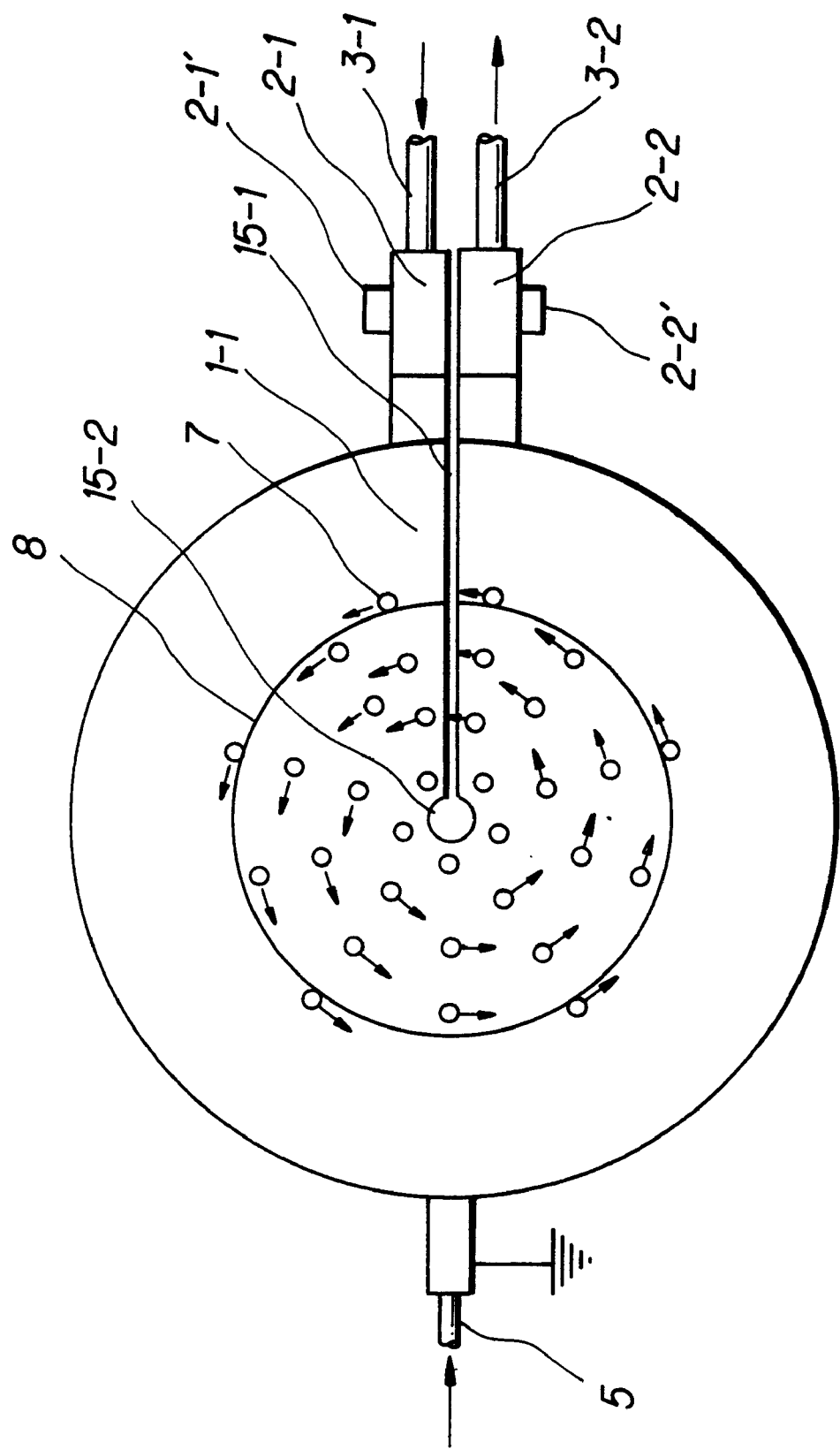
FIG. 16 is a sectional structural top view of main part of a producing apparatus for explaining a further embodiment of the present invention.
Figure 18:
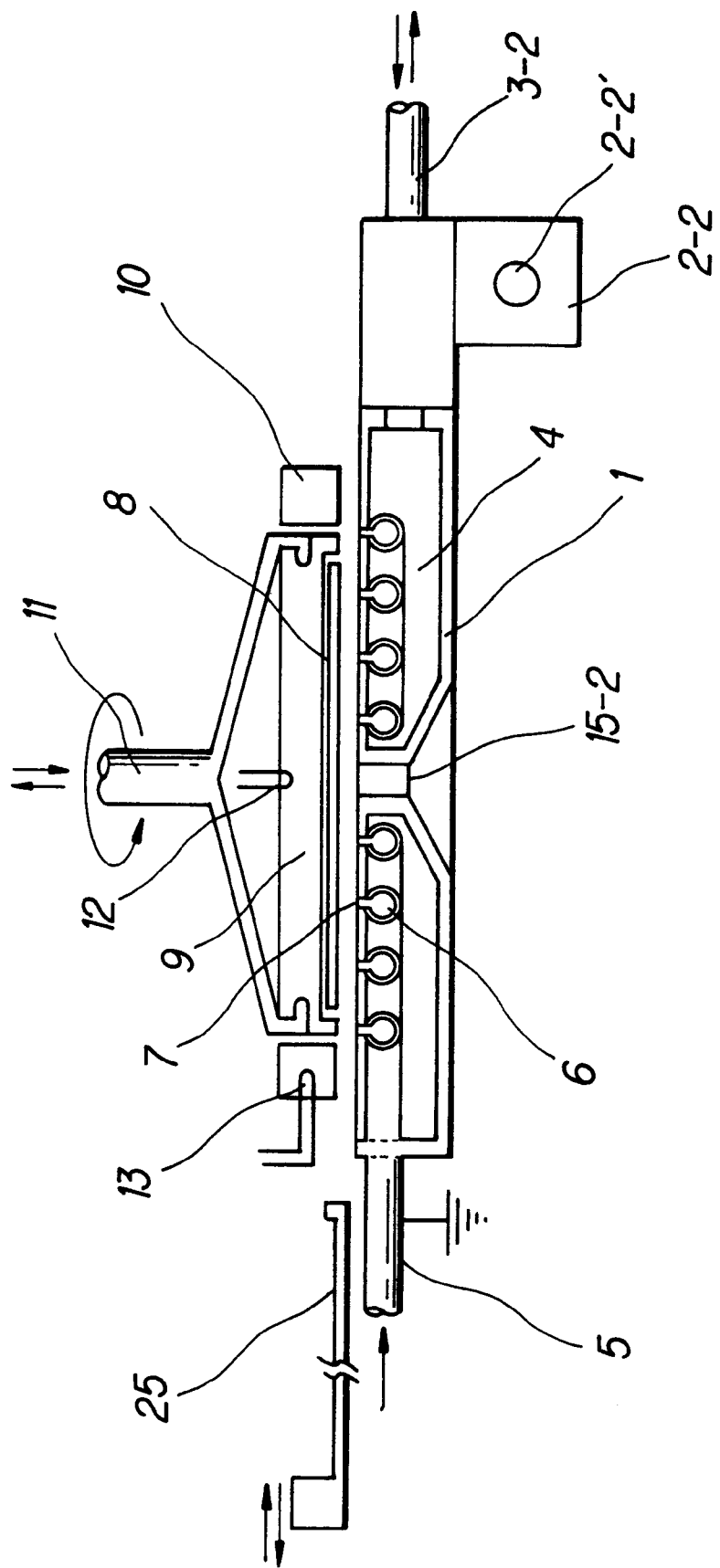
FIG. 18 is a sectional structural side view of main part of a producing apparatus for explaining a further embodiment of the present invention.
Figure 19:
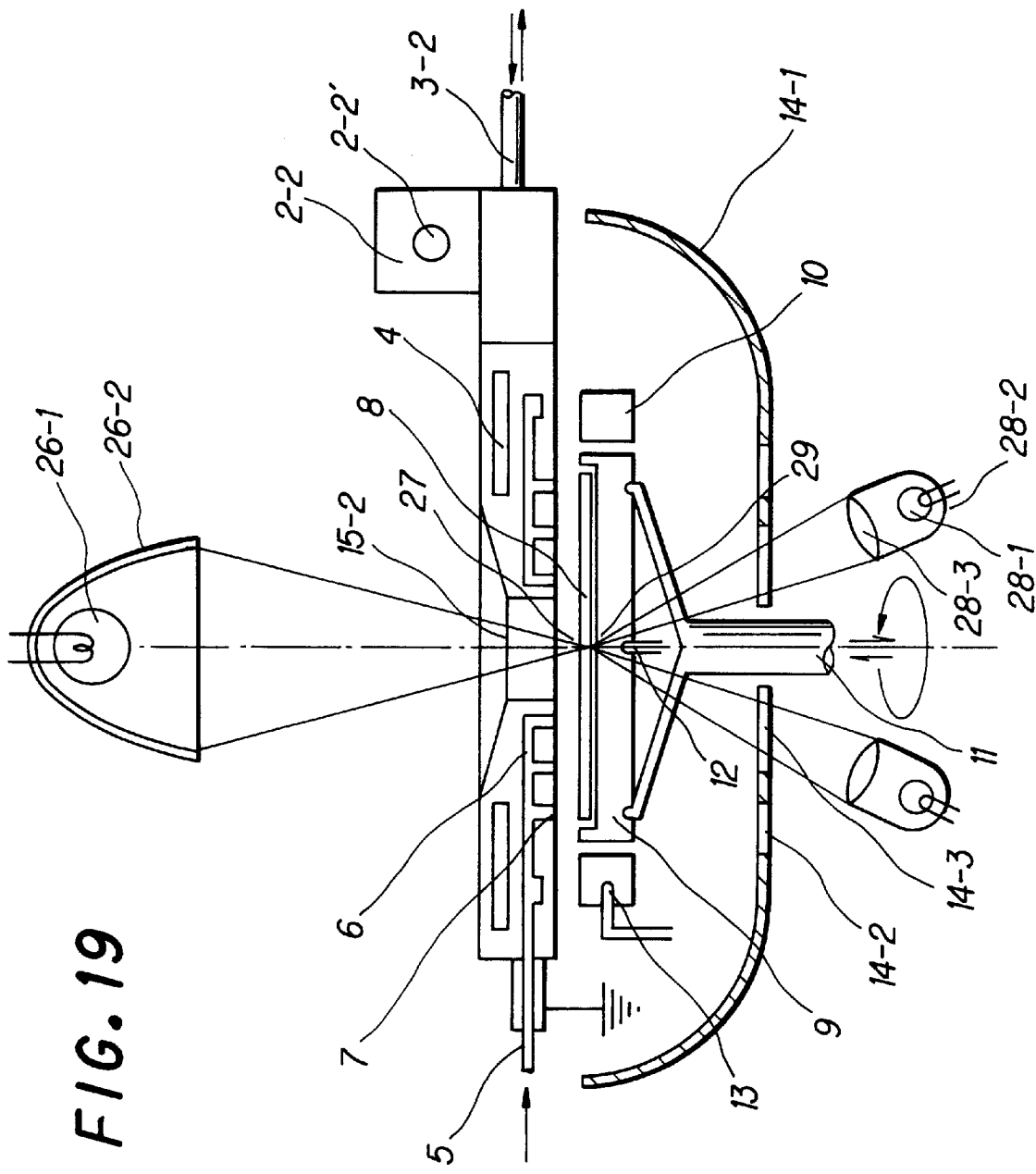
FIG. 19 is a sectional structural side view of main part of a producing apparatus for explaining a further embodiment of the present invention.
Figure 20:
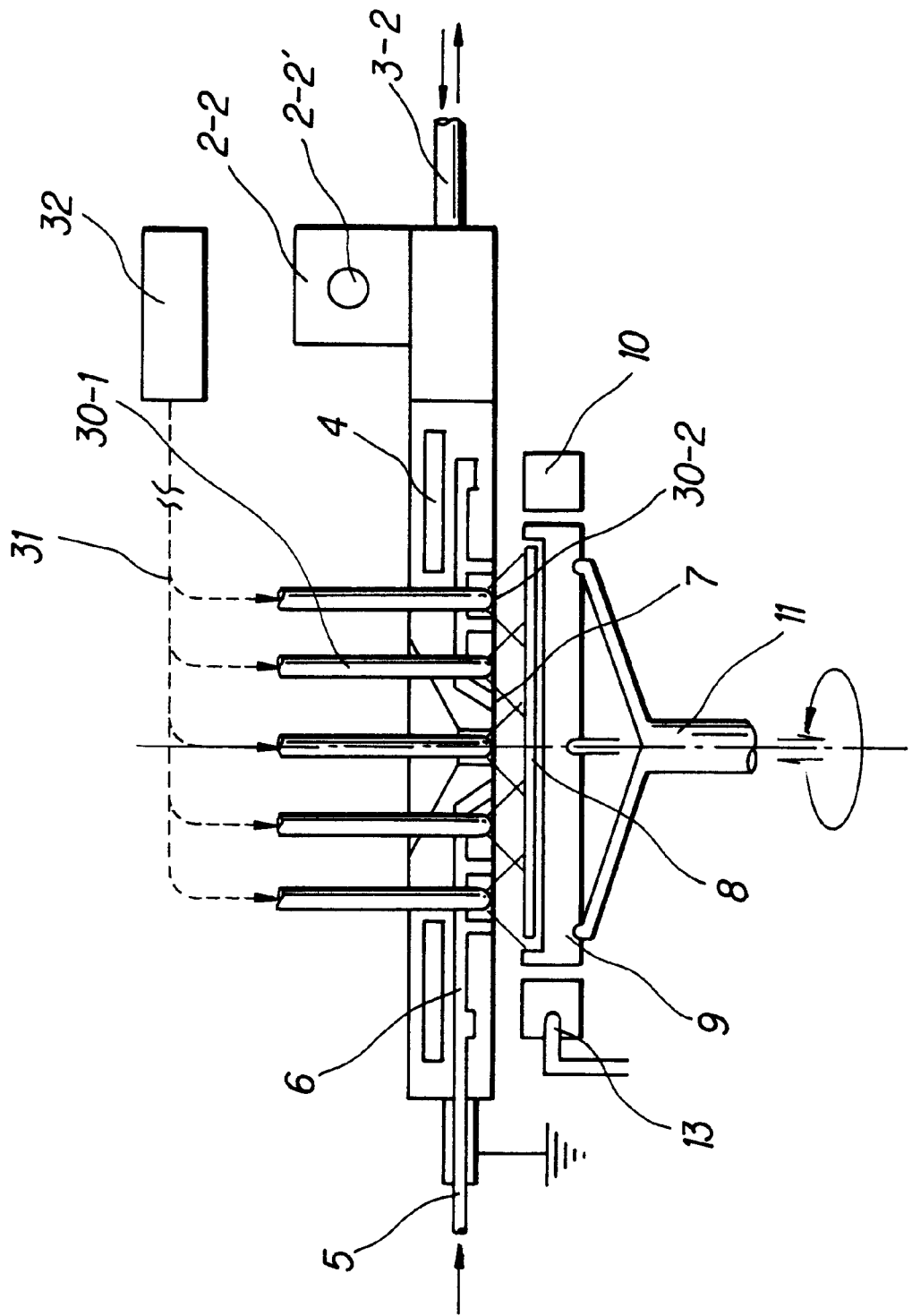
FIG. 20 is a sectional structural side view of main part of a producing apparatus for explaining a further embodiment of the present invention.
Figure 21:
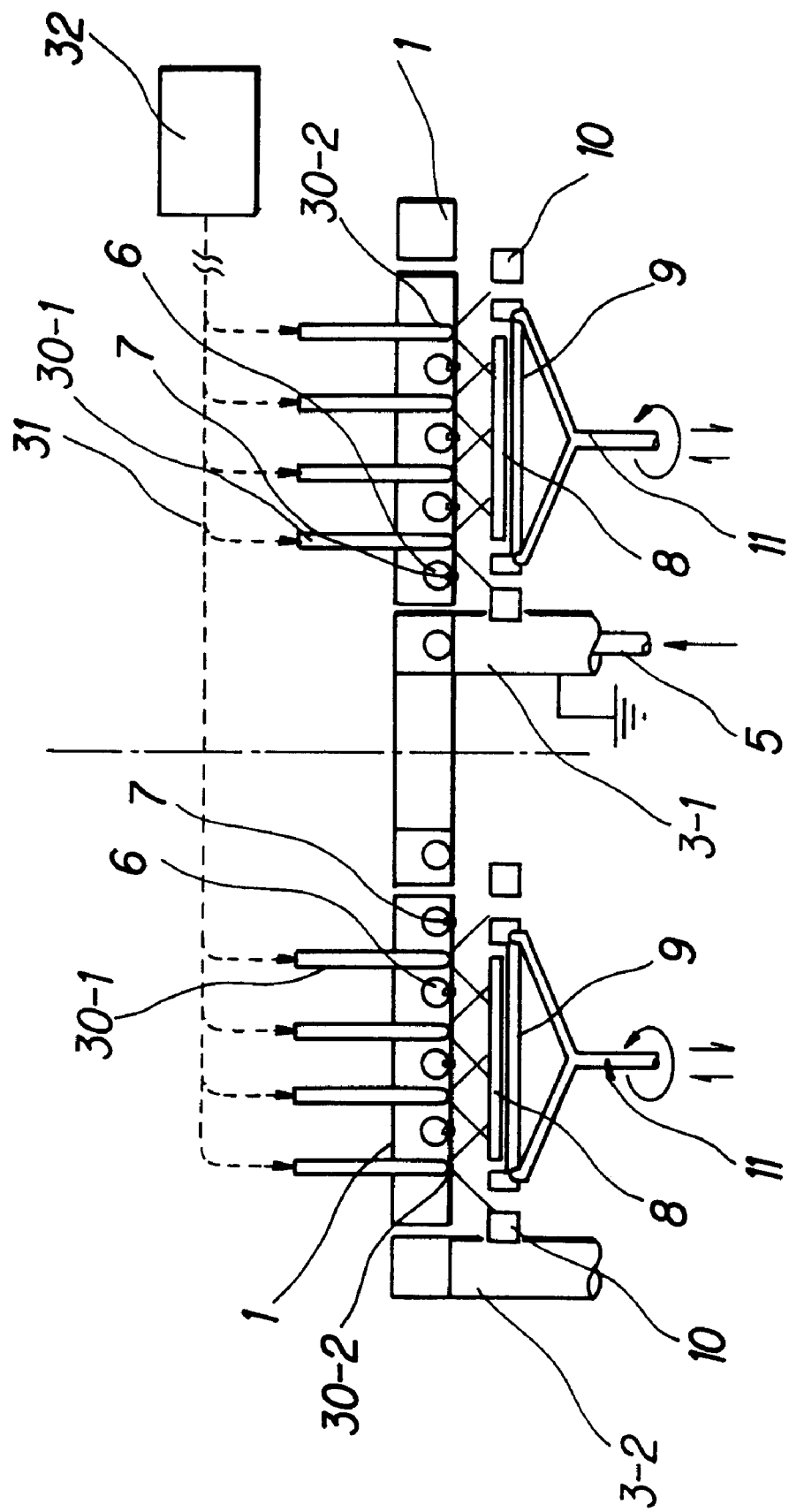
FIG. 21 is a sectional structural side view of main part of a producing apparatus for explaining a further embodiment of the present invention.
Figure 22:
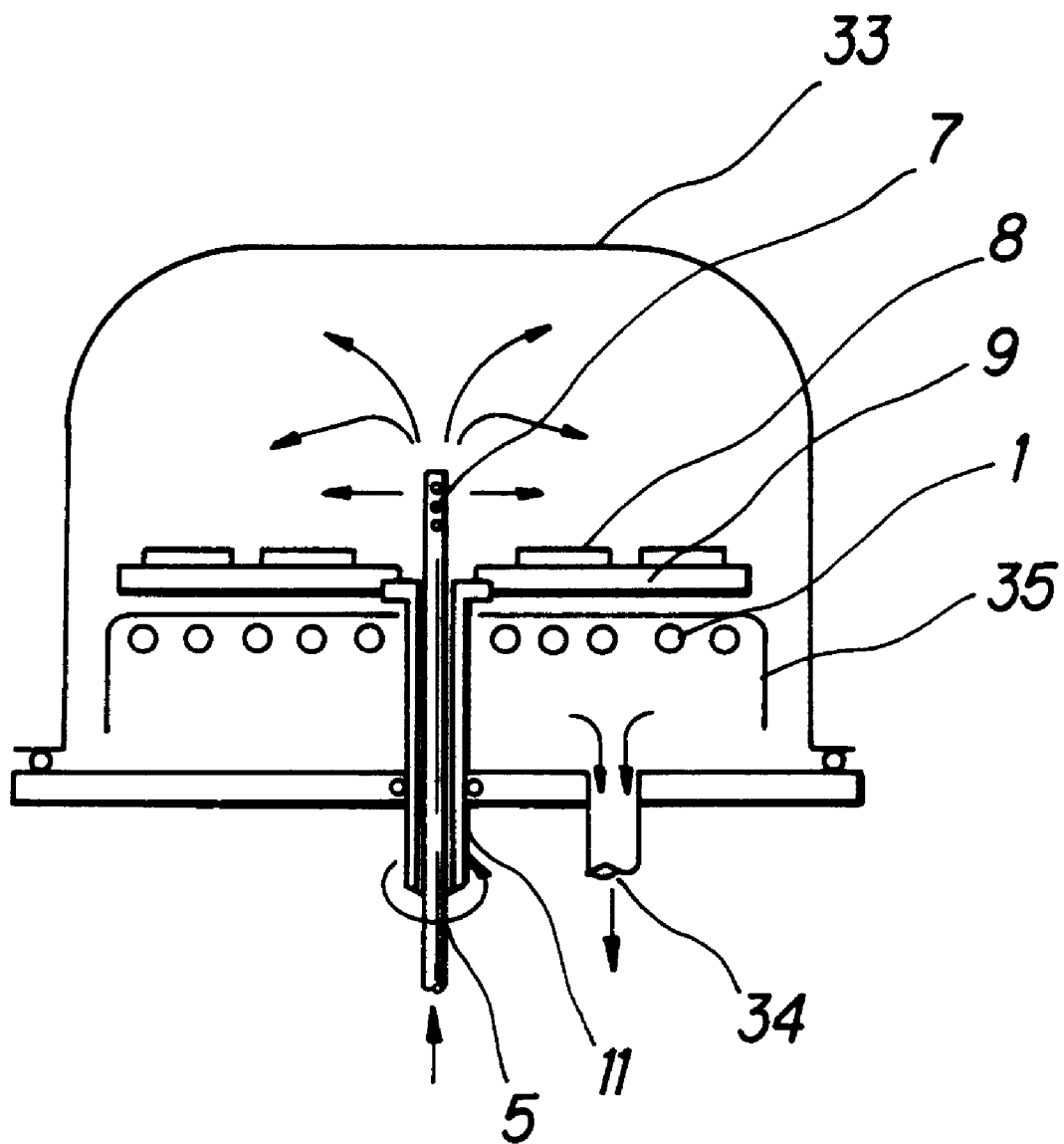
FIG. 22 is a sectional structural side view of a producing apparatus for explaining a conventional epitaxial growth method.

FIGS. 1 to 7, FIGS. 8 to 10, FIGS. 11 and 12, and FIGS. 13A to 13N are views showing the structure of the producing apparatus for explaining the five embodiments of from a first embodiment to a fifth embodiment of the present invention. FIGS. 1 to 7, FIGS. 8 to 10, and FIGS. 11 and 12 show an apparatus for producing an epitaxial monocrystal/polycrystal thin film growth substrate of a silicon semiconductor substrate wafer by using a vapor phase growth reaction and an apparatus for producing a substrate by chemical etching (gas etching) and annealing in an inert gas. FIGS. 13A to 13N shows the structure and arrangement of gas blowout ports and a high-frequency coil used in the producing apparatus depicted in FIGS. 1 to 12. FIGS. 14 and 15 are sectional views of a producing apparatus for explaining a sixth embodiment of the present invention. FIGS. 16 and 17 are views showing a producing apparatus for explaining seventh and eighth embodiments of the present invention and the structure and arrangement of gas blowout ports and a high-frequency coil used in the apparatus. FIG. 18 is a structural view of a producing apparatus for explaining a ninth embodiment of the present invention. FIG. 19 is a sectional view of a producing apparatus for explaining a tenth embodiment of the present invention. FIGS. 20 and 21 are sectional views of a producing apparatus for explaining eleventh and twelfth embodiments of the present invention. In these drawings, like numerals refer to like parts.

In the following embodiments, a method of producing a silicon monocrystal semiconductor by means of vapor deposition will be described in detail.

Figure 1:
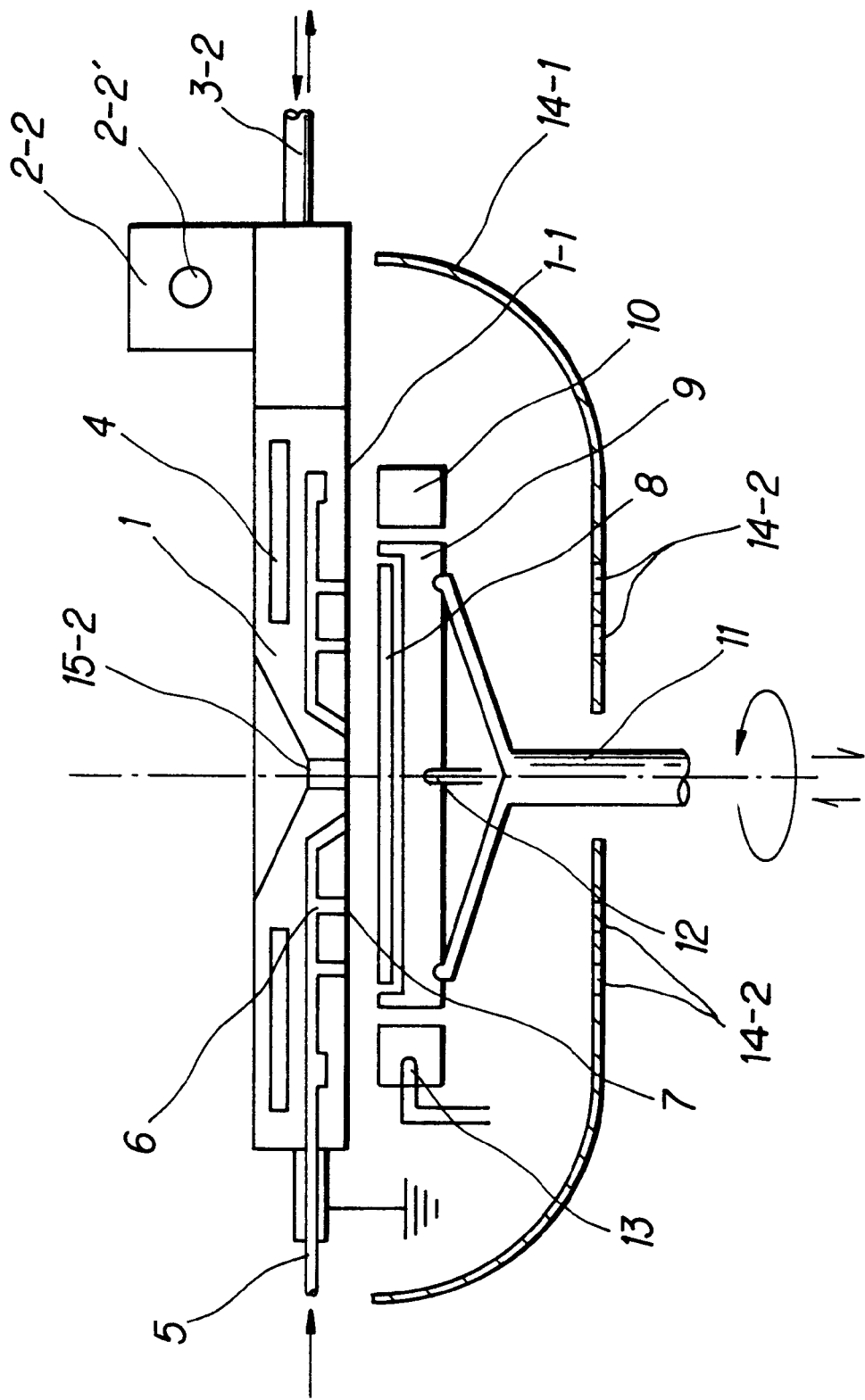
FIG. 1 is a sectional structural side view of main part of a producing apparatus for explaining an embodiment of the present invention.
Figure 2:
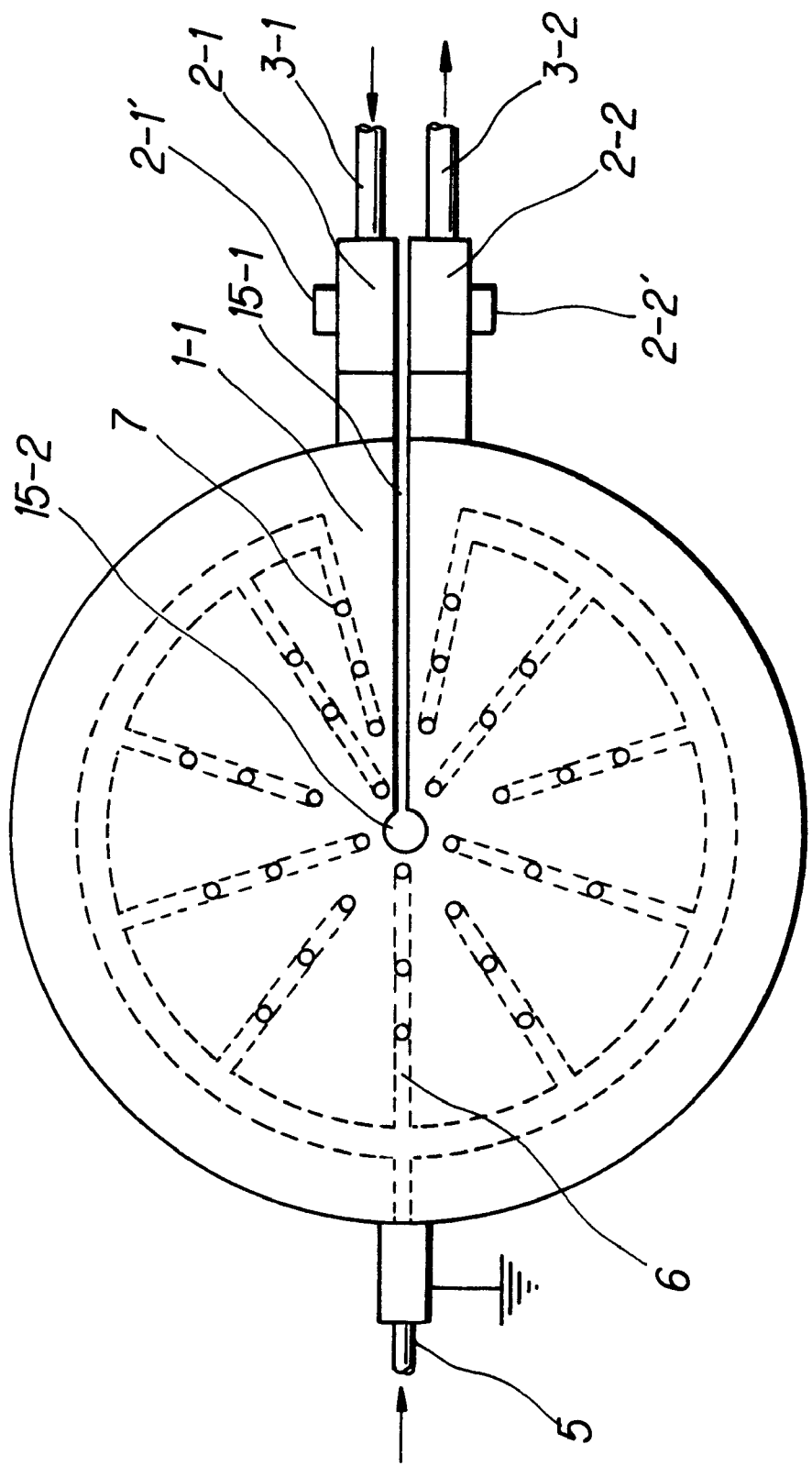
FIG. 2 is a sectional structural top view of main part of a producing apparatus from the top for explaining the embodiment of FIG. 1.
Figure 3:
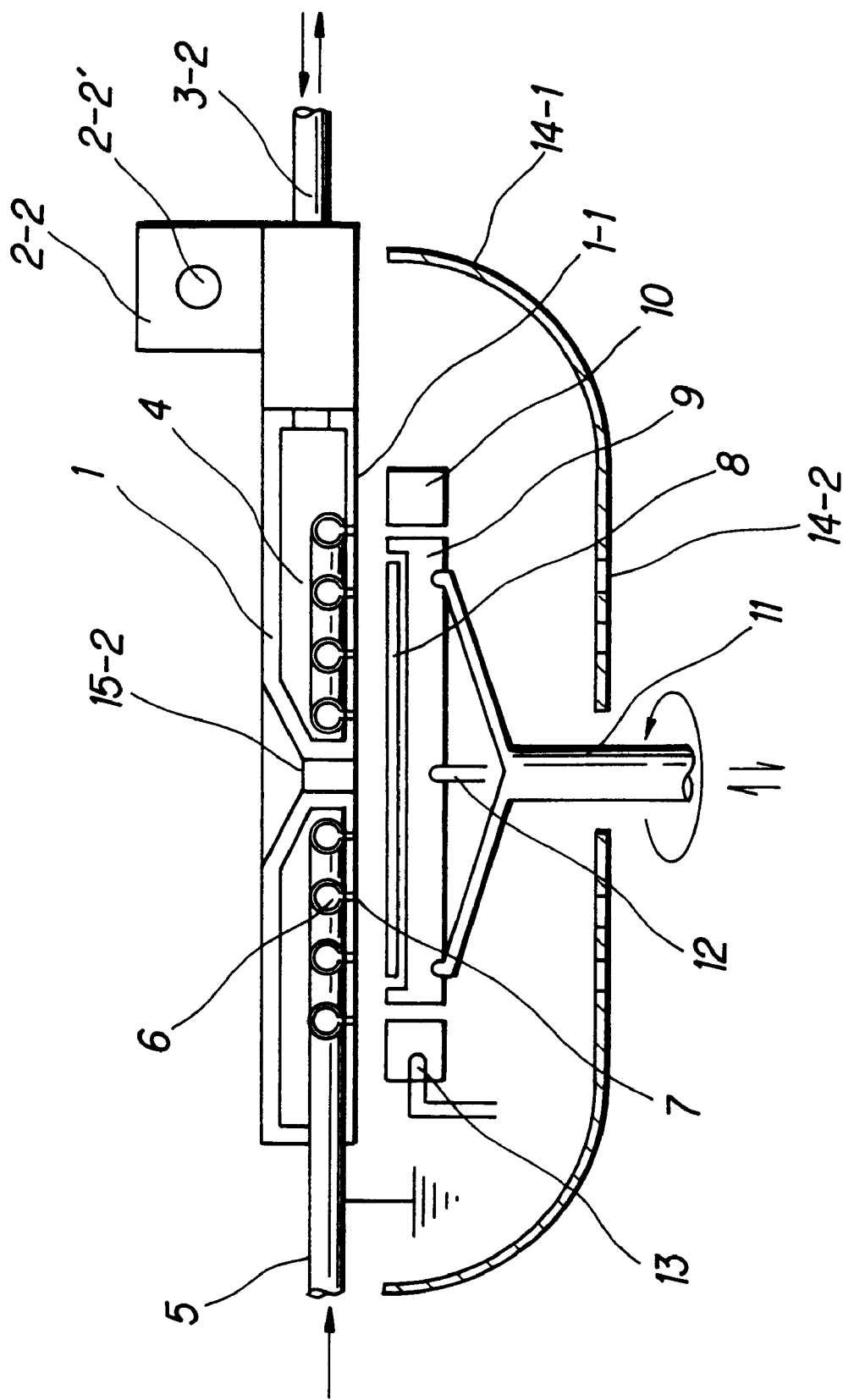
FIG. 3 is a sectional structural side view of main part of a producing apparatus for explaining another embodiment of the present invention.
Figure 4:
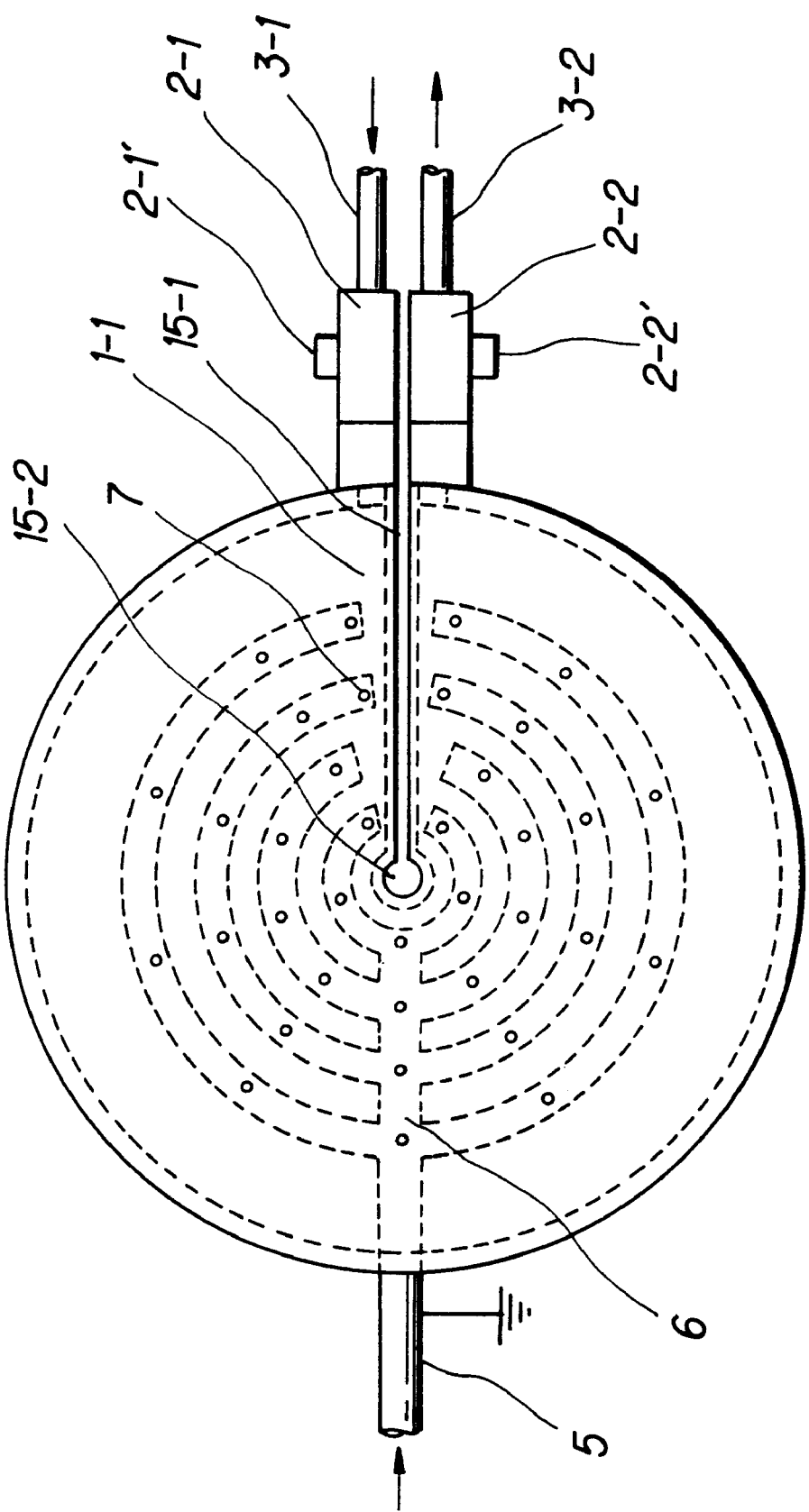
FIG. 4 is a sectional structural top view of main part of a producing apparatus from the top for explaining the embodiment of FIG. 3.
Figure 5:
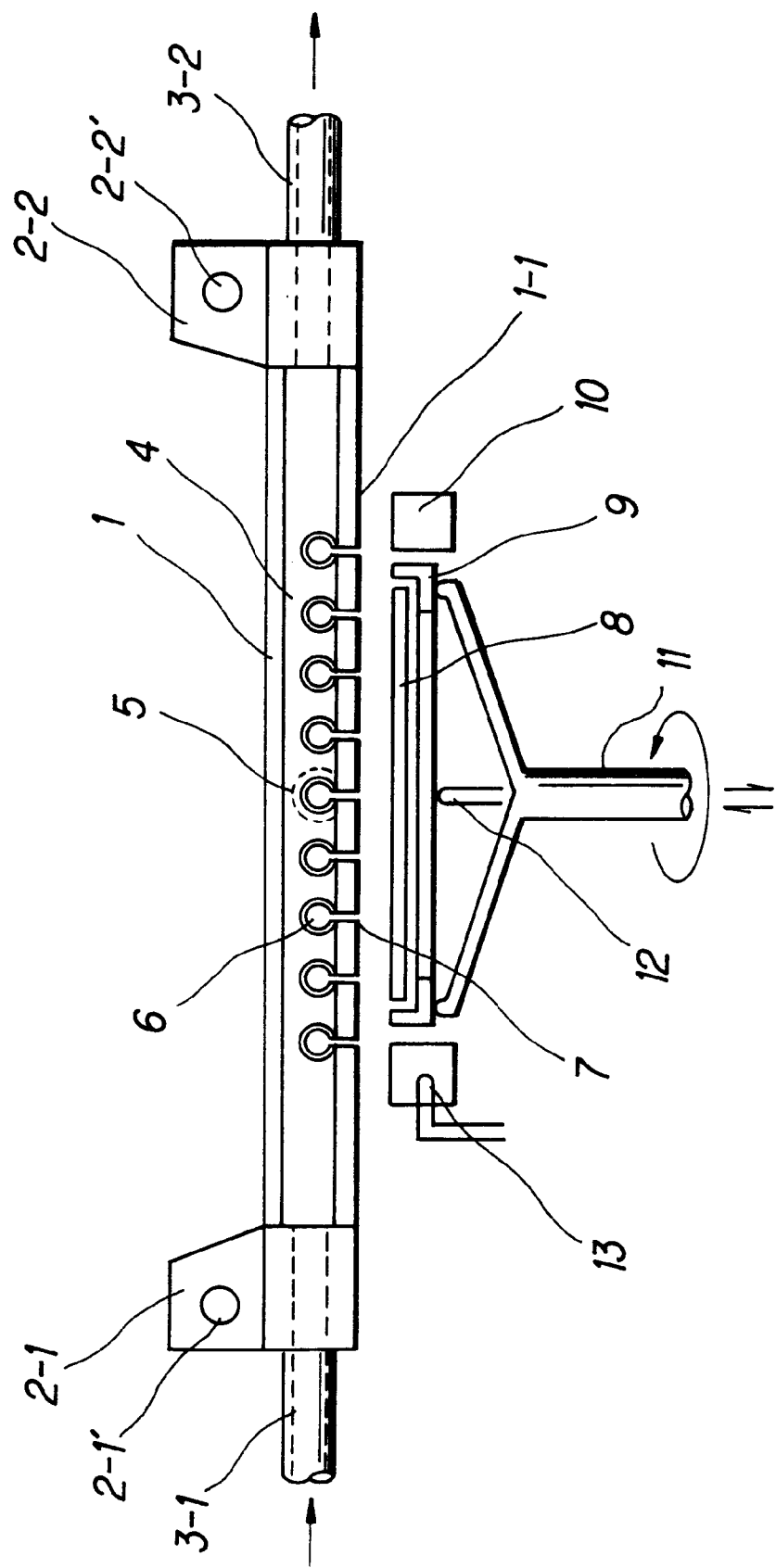
FIG. 5 is a sectional structural side view of main part of a producing apparatus for explaining an embodiment of the present invention.
Figure 6:
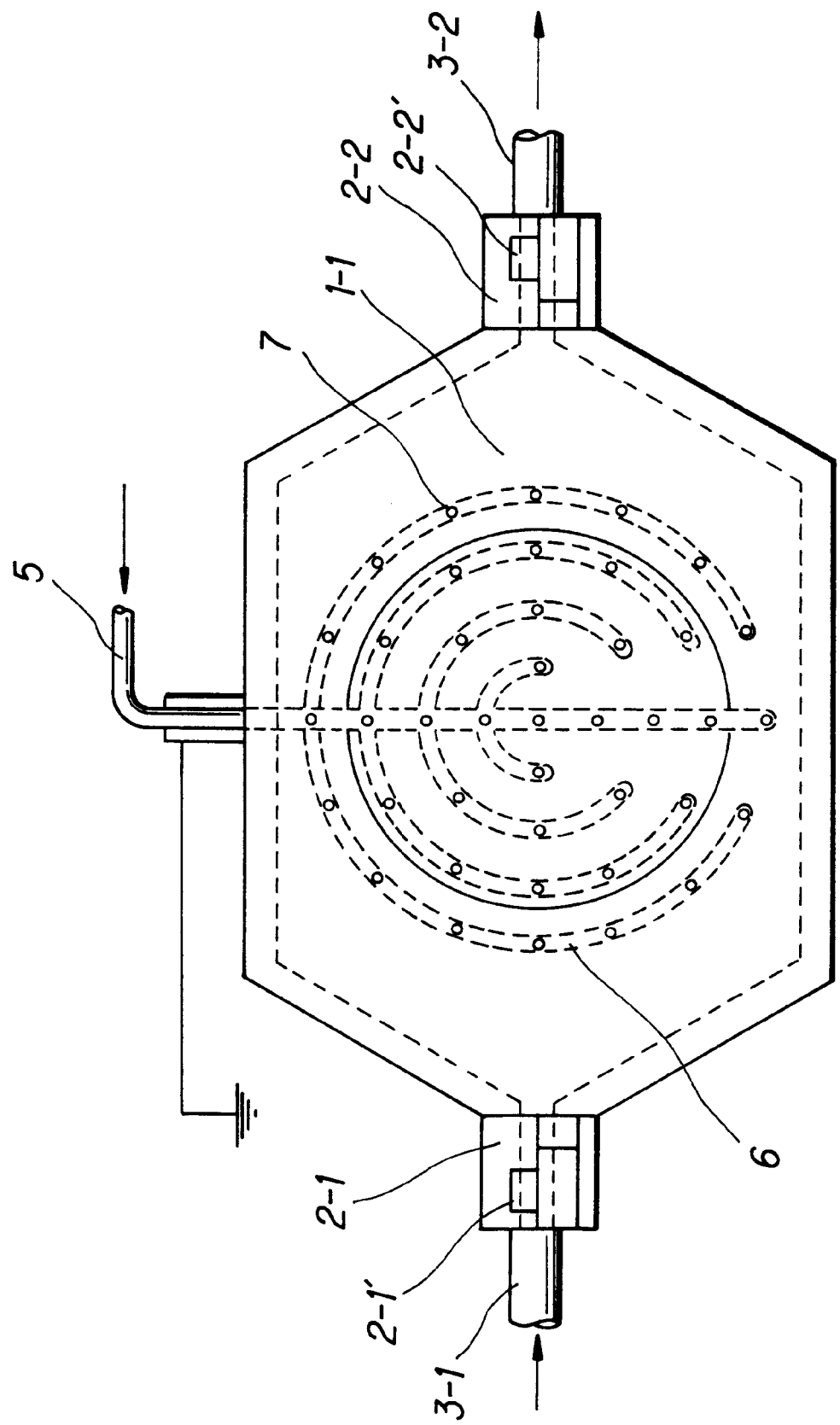
FIG. 6 is a sectional structural top view of main part of a producing apparatus for explaining the embodiment of FIG. 5.
Figure 7:
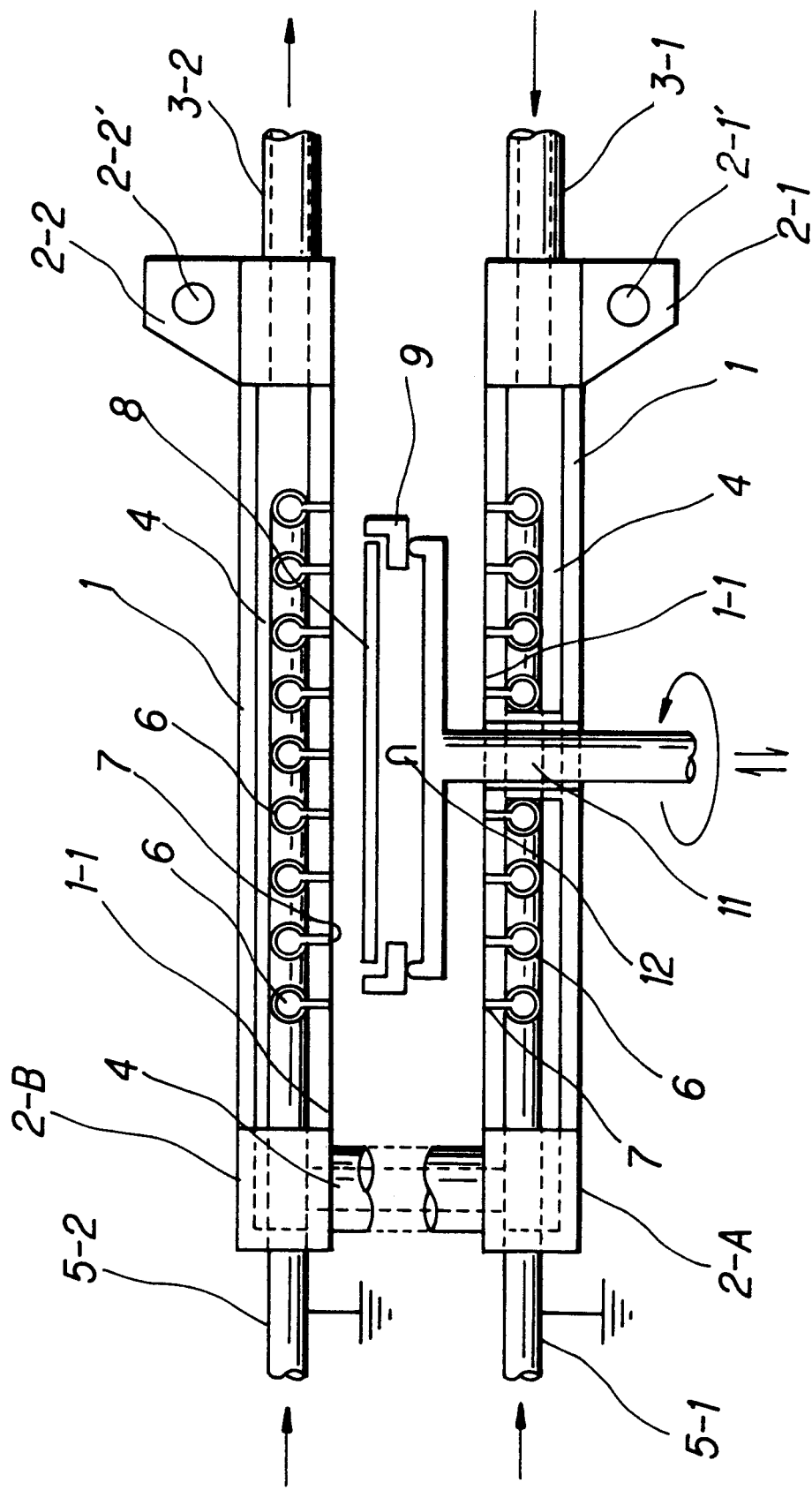
FIG. 7 is a sectional structural side view of main part of a producing apparatus for explaining an embodiment of the present invention.

Referring now to FIGS. 1 through 7, first and second embodiments of the present invention will be described. FIG. 1 is a sectional structural side view of an apparatus; FIG. 2 is a sectional structural top view of the apparatus of FIG. 1; FIG. 3 is a sectional structural side view of an apparatus; FIG. 4 is a sectional structural top view of the apparatus of FIG. 3; FIGS. 5 and 7 are sectional side views of an apparatus; and FIG. 6 is a sectional structural top view of the apparatus of FIGS, 5 and 7.

The difference between the embodiment shown in FIGS. 1 and 2 and the embodiment shown in FIGS. 3 and 4 is in the structure of provision of gas blowout ports provided in a high-frequency coil. There is no functional difference between the two embodiments. In FIGS. 1 and 2, the reference numeral 1 designates a high-frequency coil; 1-1, a gold-plated coil surface; 2-1 and 2-2, coil terminals; 2-1' and 2-2', lead wire attachment holes or screws by which lead wires from a high-frequency electric source are attached to the coil terminals, respectively; 3-1, a coil cooling water inlet; 3-2, a coil cooling water outlet; 4, a cooling water passage in the coil; 5, a gas inlet in which the intermediate point of a high-frequency voltage is grounded for the purpose of preventing electric discharge; 6, a gas piping (passage) provided in the high-frequency coil; 7, gas blow-out ports provided in the high-frequency coil surface and arranged so as to face the surface of a substrate wafer 8; 9, a substrate wafer support (susceptor formed of carbon, quartz, or the like); 10, a carbon ring; 11, a susceptor support; 12, an end of a thermocouple or radiation thermometer; 13, a thermocouple mounted on the carbon ring 10; 14-1, a gas-cooled or water-cooled reflection plate; 14-2, holes for the gas passage; 15-1, a flat-plate coil electrically insulating gap which is formed perpendicularly or obliquely with respect to the coil surface; and 15-2, a small-diameter electrically insulating gap hole in the center portion of the coil.

A quartz or sapphire plate is generally provided in the gap. In this embodiment, the substrate wafer disposed on the susceptor 9 is self-heated by high-frequency induction from the high-frequency coil 1 so that the substrate wafer is kept at a predetermined temperature and in a predetermined temperature distribution (generally, in a range of from 900° C. to 1200° C.). In this state, a reaction gas or a raw gas (generally, a mixture gas of hydrogen, nitrogen and argon as a carrier gas) given through the gas inlet 5 is sprayed, through the gas blowout ports 7 provided in the surface of the coil, toward the surface of the heated substrate wafer to perform monocrystal growth (epitaxial), polycrystal precipitation, substrate surface etching or hydrogen annealing to thereby improve the stabilization or crystal defect (quality) of the crystal surface.

In an example in which a silicon substrate is used, hydrogen, nitrogen, argon, etc. is used as a crystal substrate surface stabilizing gas or as a gas for improving the crystallinity of the crystal substrate and further, a mixture gas of hydrochloric acid/hydrogen, hydrofluoric acid/nitrogen or hydrofluoric compound/nitrogen is used as a reactive gas (etching gas) for cleaning the surface of the substrate. In the case of polycrystal or monocrystal growth, a mixture gas of a silane gas (such as $SiH_4$, $SiHCl_3$, $SiH_2Cl_2$, $SiCl_4$, etc.) and a hydrogen gas is used as a raw gas. In the case of a compound semiconductor (for example, a Group III-Group v compound), an organic metal (such as trimethylgallium, triethylgallium, etc.) and a gas such as arsine $AsH_3$, phosphine $PH_3$, diborane $B_2H_6$, etc. are used with hydrogen as a carrier gas. In the case of a Group II-Group VI compound, an organic metal (such as dimethylzinc, dimethylcadmium, etc.) and a gas such as hydrogen sulfide, hydrogen selenide, etc. are used. In the case of metal CVD, tungsten fluoride $WF_6$, molybdenum fluoride $MoF_6$ or silane $SiH_4$ is used. In the case of silicon, a necessary quantity of impurity gas (such as diborane $B_2H_6$, phosphine $PH_3$, arsine $AsH_3$, etc.) may also be added into the raw gas in order to adjust the resistivity. Also in the case of a compound semiconductor, a corresponding impurity gas may be added. Further, these reactions may be used either in the case of ordinary pressure or in the case of reduced pressure.

The susceptor 9 is supported by a jig of quartz, or the like, so that the susceptor 9 can move vertically and can rotate. The susceptor 9 is made of quartz, sapphire, carbon, silicon carbide, silicon, etc. and shaped like a flat plate, a three-point (claw) support, etc. The carbon ring 10 is disposed in the neighborhood of the susceptor 9 and made of high purity carbon, silicon, etc. The carbon ring 10 is self-heated by high-frequency induction so that the carbon ring 10 cooperates with the susceptor 9 to attain heat-retaining of the substrate wafer and evenness of the temperature distribution. As an example, the reflection plate 14-1 is disposed so that the reflection plate 14-1 cooperates with the gold-plated coil surface 1-1 to prevent the loss of energy caused by heat radiation of the substrate and of the heating element (save energy) and to retain the evenness of the temperature distribution in the substrate wafer.

FIG. 2 shows an example of the structure of the high-frequency coil depicted in FIG. 1. In FIG. 2, the coil 1 is constituted by a disk-like flat plate and formed by electrical insulation through the small-diameter gap hole 15-2 in the center portion and the gap 15-1 formed perpendicularly or obliquely with respect to the coil plane. Incidentally, insulators or transparent solids (for example, solids or flat plates of quartz, sapphire, etc.) are disposed in the gaps 15-2 and 15-1 as occasion demands. High-frequency electric power (voltage, current) is supplied between opposite terminals of the coil 1 through the terminals 2-1 and 2-2. The coil 1 is cooled through the cooling water inlet 3-1 and the cooling water outlet 3-2. The shape of the small-diameter gap hole 15-2 in the center portion of the coil 1 may be modified into a circular shape, a slit-containing (groove-containing) shape, or the like. Further, the shape of the coil surface may be symmetric may be asymmetric (eccentric, deformed) with respect to the hole 15-2.

The supply gas is supplied through the gas inlet 5 and sprayed onto the substrate wafer surface through the gas blowout ports 7 at close range via the gas passage 6 represented by the broken line in the coil 1. FIG. 2 shows the case where the gas passage and the cooling water passage are produced by means of cutting/welding a metal plate. The gas inlet 5 is grounded at the intermediate voltage point of the high-frequency voltage between the coil terminals. The substrate wafer may be also grounded through the susceptor 9 as occasion demands.

FIGS. 3 and 4 show a structure corresponding to the structure depicted in FIGS. 1 and 2. In FIGS. 3 and 4, the coil 1 is constituted by a disk-like flat plate having a hollow structure. There is shown a structure in which the passage 6 of the supply gas fed into the coil 1 is connected to the inner surface of the coil 1 by a branch piping. For example, a copper or stainless steel pipe is used as the material for the piping. The piping is welded to the coil conductor and has a plurality of holes which face on the coil surface at the blowout ports 7.

In FIG. 1, the substrate wafer which is disposed in the neighborhood of the high-frequency coil (the distance between the coil surface and the substrate wafer is in a range of from 5 mm to 30 mm) is subjected to inductive coupling efficiently (with high coupling conversion efficiency) so that the substrate wafer is self-heated by a high-frequency induction current which is induced in the wafer. The high frequency used is in a range of from 10 KHz to 10 and several MHz. Further, a plurality of frequencies may be also supplied as the high frequency. In the case of a silicon substrate, the resistivity thereof generally varies in a wide range of from $10^3$ $\Omega\cdot cm$ to $10^{-3}$ $\Omega\cdot cm$ at room temperature. Accordingly, in the case where the resistivity of the substrate wafer is not higher than several $\Omega\cdot cm$, the induction current flows in the substrate wafer easily so that the substrate wafer can be self-heated easily.

A P type (P+) or N type (N+) material of low resistivity (in a range of from 0.02 Ω·cm to 0.003 Ω·cm) is used as an epitaxial wafer for a so-called MOS (Metal Oxide Semiconductor) or BI·CMOS (Bipolar complementary MOS) which is most widely used in memories, microprocessors, etc. In the case of a semiconductor of high resistivity, on the contrary, a long time is required for temperature rising because the initial induction current hardly flows therein. Although a silicon crystal exhibits high resistivity (in a range of from 10 Ω·cm to 1000 Ω·cm) at room temperature the resistivity of the silicon crystal comes to be in a range of from 1 Ω·cm to 0.1 Ω·cm at a temperature in a range of from 400° C. to 600° C. so that the induction current flows easily. On the other hand, the resistivity of a gallium arsenide (GaAs) crystal, which exhibits high resistivity (in a range of from 10 MΩ·cm to several MΩ·cm) at room temperature, comes to be in a range of from 5 Ω·cm to 0.1 Ω·cm at a temperature in a range of from 400° C. to 600° C. Accordingly, if the substrate is wholly or partly pre-heated to a temperature in a range of from 400° C. to 600° C. auxiliarily and indirectly at the initial heating stage, the substrate can be self-heated easily.

As means for auxiliary heating (pre-heating), a solid substrate pre-heated in the preceding stage may be used, or, for example, low specific resistance silicon, high purity carbon, or the like, may be used as the material for the susceptor 9. Alternatively, infrared heating may be used additionally. The purpose of auxiliary heating can be achieved by such means. Incidentally, when the substrate is heated to a temperature in a range of from 400° C. to 600° C. by use of such means, the occurrence of slipping, or the like, in the crystal substrate is not observed.

With respect to general epitaxial growth, in the case of monosilane ($SiH_4$), because $SiH_4$ supplied is exposed to a high temperature for a long time in a vapor phase so that a vapor phase uniformizing reaction promotes a decomposing reaction ($SiH_4 \rightarrow Si+2H_2$) before $SiH_4$ reaches the surface of the substrate, a large number of silicon fine particles are produced in the vapor phase and deposited onto the silicon substrate to cause surface cloudiness (haze) and projecting deficiency (mound). As a result, the crystallinity of the growth layer is lowered. As a countermeasure, reduced-pressure growth, addition of hydrogen chloride, or the like, is employed to prevent the lowering of the crystallinity.

In the case where silicon tetrachloride ($SiCl_4$) is used as the raw gas, the epitaxial reaction is a reducing reaction $SiCl_4+2H_2Si+4HCl$. If the quantity of supply of $SiCl_4$ is large, the concentration of hydrochloric acid (HCl) generated in the surface of the substrate wafer is increased so that the reverse reaction becomes predominant. As a result, a phenomenon in which corrosion or etching by HCl is caused in the surface of the substrate wafer reversely to growth, so that the growth speed is lowered when the concentration of HCl is not lower than a certain critical value.

Furthermore, with respect to general silicon epitaxial growth, in the case where a low resistivity substrate containing a high concentration of impurities (such as boron, arsenic, phosphorus, etc.) is used as the substrate wafer, the impurities in the substrate wafer are mixed into the reaction gas again by outward diffusion from the inside of the solid surface and by gas etching due to chlorine gas in the gas in the process of epitaxial growth, so that the impurities are incorporated into the growth crystal layer. As a result, automatic impurity addition (auto-doping) occurs to have influence on the interface (transition region) between the substrate and the epitaxial growth layer and on the distribution of the impurities in the growth layer to thereby make it difficult to control the distribution of resistivity in the epitaxial growth layer. In order to prevent this problem, the rear surface of the substrate wafer is coated with an oxide film ($SiO_2$) or a nitride film ($Si_3O_4$) in advance.

According to the present invention, a reaction gas or a raw gas is sprayed onto a necessary region through the gas blowout ports 7 which are provided in the coil surface in a close range so as to face on the surface of the substrate kept at a high temperature. Accordingly, the flow rate of the gas supplied to the surface of the substrate wafer is effectively high. Furthermore, since the reaction product gas (such as chlorine, hydrogen chloride, silicon chloride, etc.) is ejected rapidly, the reaction rate or epitaxial growth rate on the surface of the substrate wafer can be improved remarkably. Furthermore, since the supplied gas is not exposed to a high temperature for a long time in a vapor phase, the occurrence of crystal defects such as mound, etc. can be suppressed. Furthermore, since the reaction product gas is discharged unidirectionally toward the periphery of the substrate wafer, auto-doping hardly occurs because the impurity gas generated in the substrate from the rear surface of the substrate wafer does not go back into the surface of the substrate wafer. Accordingly, controlling the resistivity of the epitaxial growth layer is improved. For example, even if there is provided no oxide film on the rear surface of the substrate wafer, in the case of epitaxial growth of a $P/P^+$ layer, the resistivity can be controlled within a range of from the order of tens Ω·cm to 1000 Ω·cm. That is, coating on the rear surface with an oxide film is not required.

Furthermore, in the present invention, high-frequency inductive self-heating of the substrate wafer is used. Accordingly, there is no local temperature gradient produced by heat conduction as in the case of conventional indirect heating. That is, the temperature distribution in the substrate wafer is uniform, so that the occurrence of crystal defects such as slipping, etc. is reduced greatly. Accordingly, rapid heating can be performed. Furthermore, the susceptor for holding the substrate wafer can be reduced in size (reduced in heat capacity). Accordingly, efficient rapid cooling can be performed by spraying the cooled inert gas through the gas blowout ports 7 after the reaction or heating process. That is, rapid temperature rise due to self-heating, high-speed growth and rapid cooling can be attained, so that great improvement of throughput can be attained by the shortening of the growth cycle time.

FIG. 5 shows an example of the structure in which a plane conductive region with a wide area is formed as a part of the conductor constituting a high-frequency resonance circuit so that the substrate is heated by using a high-frequency induction field produced in the periphery of the plane conductive region. FIG. 6 shows the sectional structure of this apparatus from the top. In the structure, the arrangement of the substrate wafer and the gas blowout ports is shown. The function of the apparatus is the same as shown in FIGS. 1 to 4. This apparatus is characterized in that this apparatus has a plane structure; the distance between electrodes in the neighborhood of the reaction region is large so that electric discharge hardly occurs; and the structure is extremely simple because this apparatus has a plane structure. Further, a large number of substrates can be processed simultaneously by disposing such apparatuses in series (linearly or circularly).

FIG. 7 shows an example in which: two plane conductors of the type shown in FIGS. 5 and 6 are used in series; electrodes 2-A and 2-B of the two plane conductors are connected to each other so that a loop (coil) is constituted by the conductors; and the substrate wafer is disposed between the two plane conductors. In FIG. 7, the intensity of a high-frequency induction field is increased so that the substrate wafer is heated rapidly. At the same time, gases may be supplied to the substrate wafer from the two surfaces thereof. That is, a raw gas (containing a dopant) is supplied from the upper gas blowout ports to perform epitaxial growth on the substrate wafer whereas an inert gas (such as hydrogen, argon, etc.) is sprayed from the lower portion of the substrate wafer to prevent reaction/precipitation on the rear surface of the substrate wafer. Even in the case where the gases to be sprayed are arranged so as to be reversed in kind, the same effect as described above is achieved.

Further, the two surfaces of the substrate wafer can be subjected to epitaxial growth simultaneously by supplying raw gases (different in kind of dopant) onto the two surfaces. Further, two substrate wafers may be arranged back to back with each other so that the respective front surfaces of the two substrates can be also subjected to epitaxial growth at the same time. Further, the substrate wafer can be cooled rapidly from the two surfaces by switching the reaction gas over to the inert gas after the reaction. This apparatus has aforementioned and other many advantages and can be applied more variously.

Although FIGS. 1 to 7 have shown specific embodiments in the case where these apparatuses are used singly, it is a matter of course that these apparatuses can form various combination structures. For example, a plurality of apparatuses may be arranged so as to look plane or solid, and electrodes may be connected in parallel or series so that a plurality of substrate wafers can be processed.

Although the center of the high-frequency coil and the center of rotation of the substrate wafer are generally used so as to be substantially coincident with each other in the case of the sheet form exemplified in FIGS. 1, 3, 4 and 7, these centers may be made eccentric as occasion demands. This rule applies to the following embodiments. Further, each of the gas blowout ports (nozzles) 7 may be a circular, polygonal, elliptic or continuous linear groove or may be a branch blowout nozzle.

Figure 8:
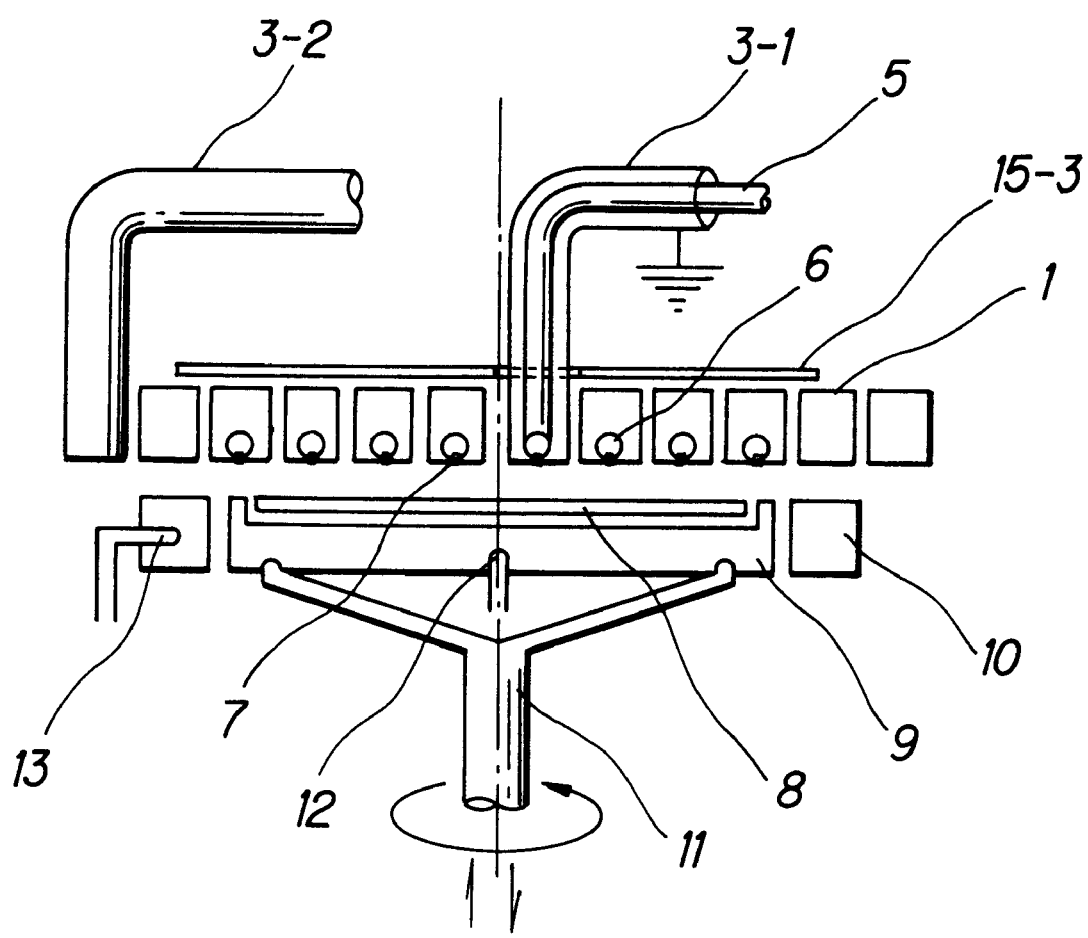
FIG. 8 is a sectional structural side view of main part of a producing apparatus for explaining another embodiment of the present invention.

FIG. 8 shows an example using a flat-plate-like compound-winding coil having the same function as that of the flat-plate-like single-winding coil depicted in FIG. 1. In FIG. 8, gas introduction pipes 6 are arranged along water-cooled coil conductors (pipes) via a gas inlet 5 in the coil terminal 3-1 of the high-frequency coil 1, so that a supplied gas is sprayed and supplied onto a surface of the substrate wafer through the gas blowout ports 7 which are provided along a plane opposite to the substrate wafer. The reference numeral 15-3 designates an insulating solid plate which is provided to prevent the going-around of the reaction product gas or the electric discharge between the coil conductors. A transparent quartz plate, or the like, is used as an example of the insulating solid plate. The insulating solid plate is applied to the whole of the coil rear surface or to a limited necessary region of the coil rear surface opposite to the substrate wafer. The flat-plate-like compound-winding coil may be a multiplex compound-winding coil.

Figure 9:
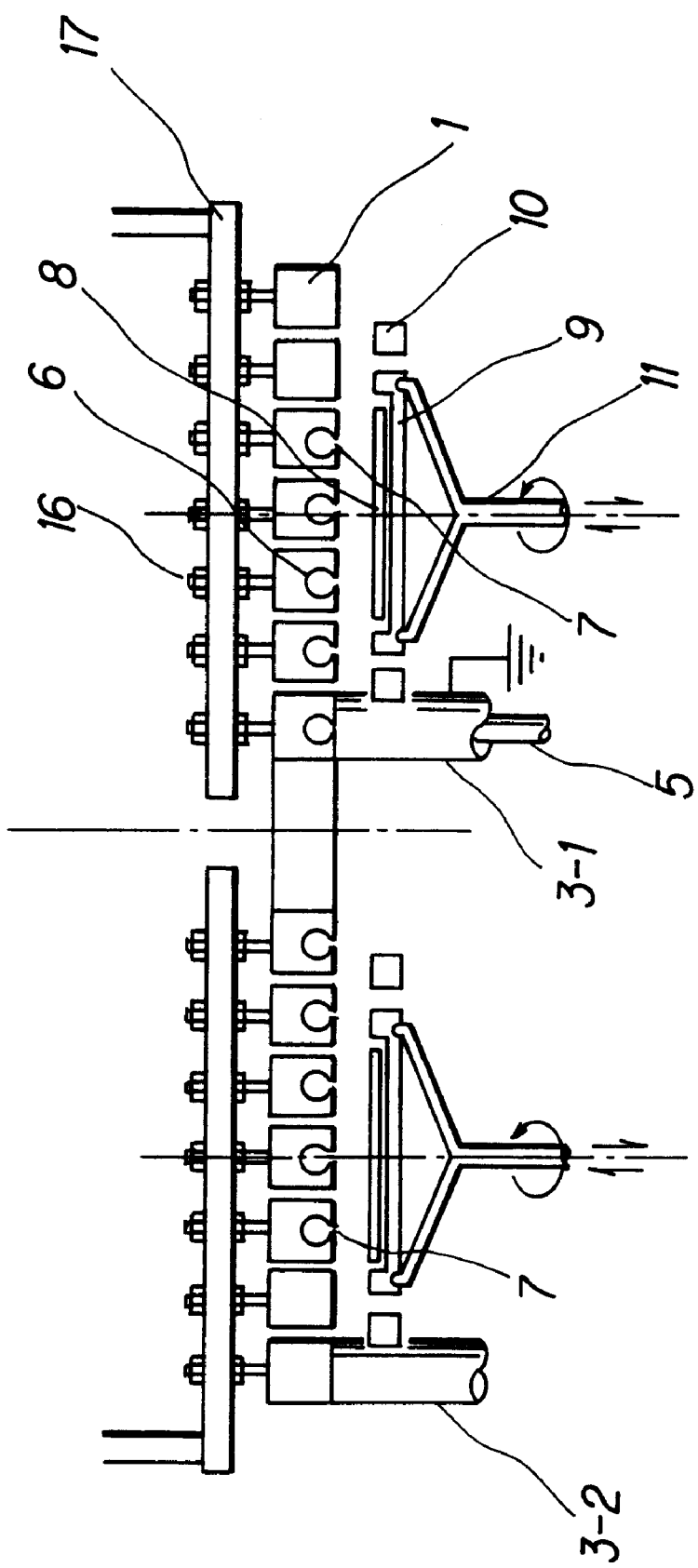
FIG. 9 is a sectional structural side view of main part of a producing apparatus for explaining an embodiment of the present invention.

FIG. 9 shows a structure in which large-scale flat-plate-like compound-winding coils are used so that a plurality of independently rotatable substrate wafers and supports thereof are arranged. In FIG. 9, the large-scale coils are fixed/supported to coil fixing supports (plates) by coil fixing stop screws 16. Like FIG. 8, the supplied gas passes through the gas introduction pipes 6 arranged along the water-cooled coil conductors (pipes) and is sprayed from the gas blowout ports 7 which are provided only in limited regions opposite to the substrate wafers. Incidentally, the insulating flat plate 15-3 is not shown in FIG. 9 for the sake of convenience.

Figure 10:
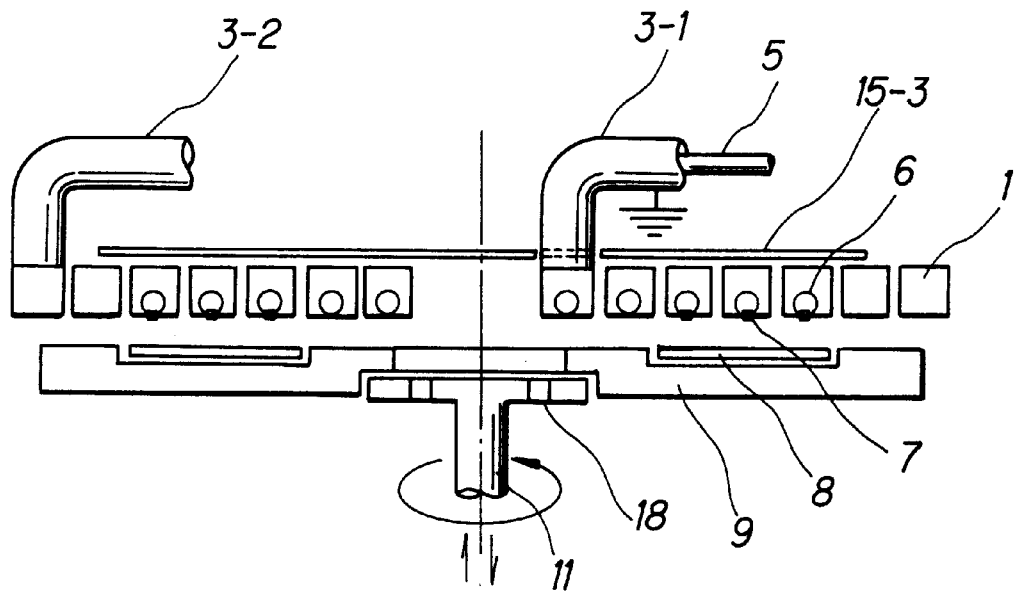
FIG. 10 is a sectional structural side view of main part of a producing apparatus for explaining an embodiment of the present invention.

FIG. 10 shows an example of an apparatus in which large-scale flat-plate-like compound-winding coils are used in the same manner as in FIG. 9 so that a plurality of substrate wafers are put on a suscept supported by a rotatable support and are subjected to reaction. In FIG. 10, in the condition in which a gas is supplied from gas blowout ports 7 provided in coil surfaces opposite to the substrate wafers, the plurality of substrate wafers rotate under the coil surfaces to perform heating, reaction and epitaxial growth. The reference numeral 15-3 designates an insulating flat plate; and 18, a reaction product gas exhaust hole provided in the support 11.

Figure 11:
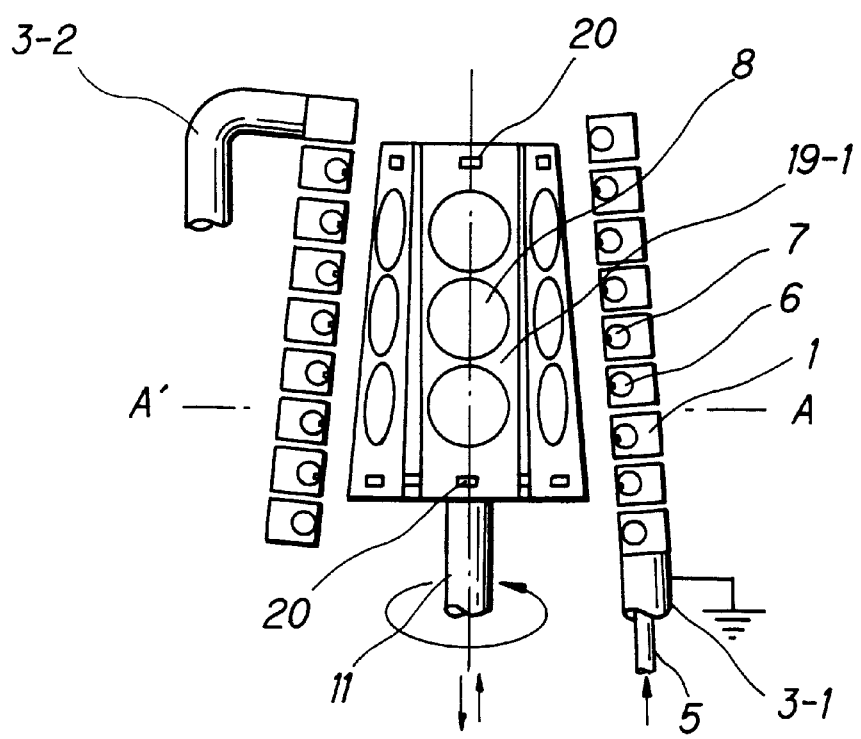
FIG. 11 is a sectional structural side view of main part of a producing apparatus for explaining an embodiment of the present invention.

FIG. 11 shows an example of the structure in which: cylindrical or conical compound-winding coils are used; a rotatable substrate support (made of quartz or carbon) 19-1 having a plurality of trapezoid surfaces is arranged in the inside; substrate wafers are fixed onto the substrate support 19-1; and a gas is sprayed through the gas blowout ports 7 from high-frequency coil surfaces opposite to the substrate wafers and, at the same time, epitaxial growth is performed while induction heating is performed. The substrate support 19-1 is composed of one stage or a plurality of stages. The substrate wafers are fixed to pockets (not shown).

Figure 12:
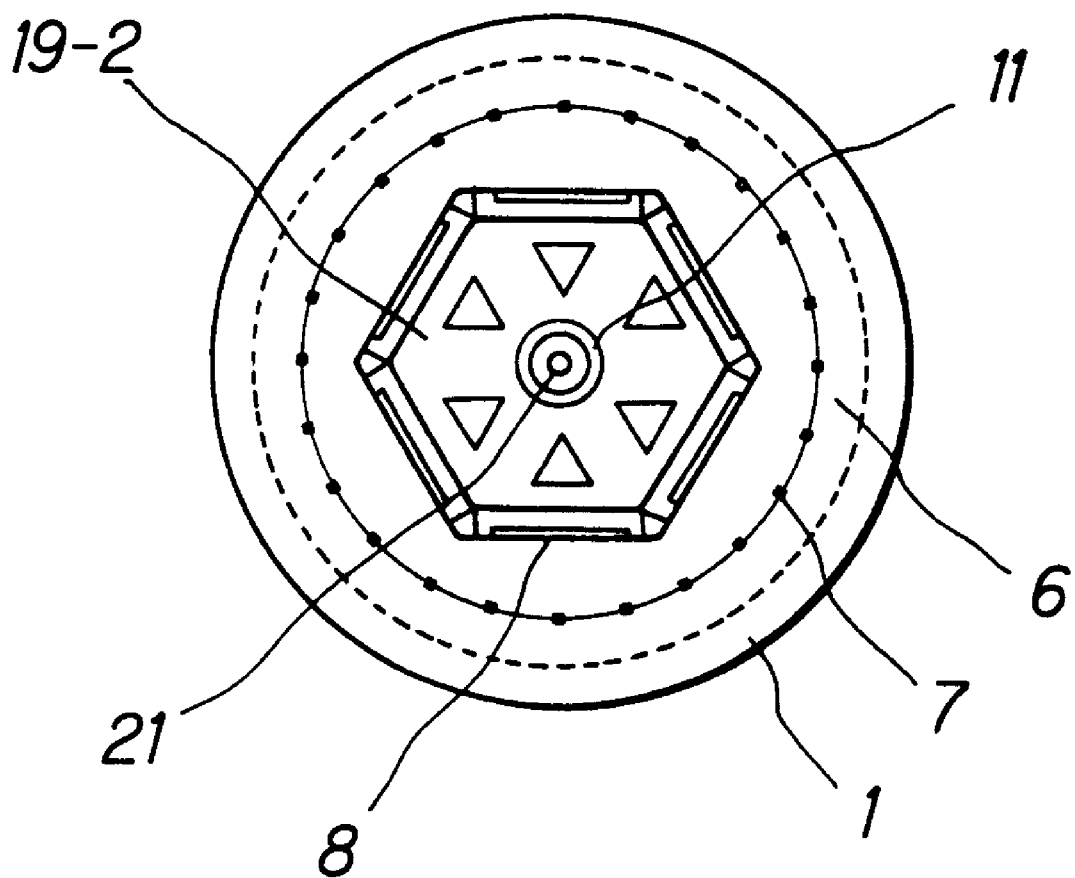
FIG. 12 is a sectional view taken along the line A–A' of FIG. 11.

FIG. 12 is a sectional view taken along the line A–A' of FIG. 11 and shows the arrangement of the substrate wafers 8, the substrate support 19-1, the high-frequency coil 1 and the gas blowout ports 7. The reference numeral 19-2 designates upper and lower plate for assembling and fixing the substrate support 19-1. The upper and lower plates 19-2 have a plurality of holes which serve as exhaust gas passages. The substrate support 19-1 and the upper and lower plates 19-2 are fixed to each other through set-holes 20. The reference numeral 21 in the center of FIG. 12 designates a radiation thermometer or a plurality of radiation thermometers arranged in the center of a water-cooled prop (for example, transparent quartz pipe) 11 supporting the substrate support. The radiation thermometers 21 measure the temperature of the substrate support or wafer (at three points, that is, at upper, intermediate and lower points) to control the temperature distribution thereof.

Although the structure shown in FIG. 11 has been described as an example, it is possible to employ a structure in which: the substrate support is arranged on the outer periphery; the high-frequency coil is arranged in the inside; and substrate wafers are set on the inner surfaces of the support so as to be opposite to the high-frequency coil so that a gas is sprayed from the coil. Alternatively, it is possible to employ a structure in which hooks are provided in susceptor pockets and the structure of FIG. 11 is rotated by 180°.

In the conventional apparatus (barrel type epitaxial furnace) using a trapezoid substrate support, a gas hardly goes round to the lower portion because the gas is sprayed from the upper portion. As a result, gas components vary widely, so that the thickness and resistivity of the epitaxial growth layer are not uniform between the upper portion and the lower portion. In the present invention, the thickness and resistivity of the epitaxial growth layer are improved greatly because not only heating (direct substrate heating) can be performed at close range but also uniform gas supply can be performed.

FIGS. 13A to 13N show examples of the structure and arrangement of the gas blowout ports and the high-frequency coil used in FIGS. 1 to 7, FIGS. 8 to 10 and FIGS.

11 and 12. The reference numeral 1 designates a coil; 1-1, a material, such as a gold-plated material, a silver-plated material, etc., having a high reflectance at a coil surface opposite to a substrate wafer; 4, a cooling water passage; 6, a supply gas passage; 6', a weld portion; 6-1 and 6-2, separated supply gas passages; 7, a gas blowout port; and 7-1 and 7-2, gas blowout ports for spraying the same kind or different kinds of separated supply gases.

Figure 13B:
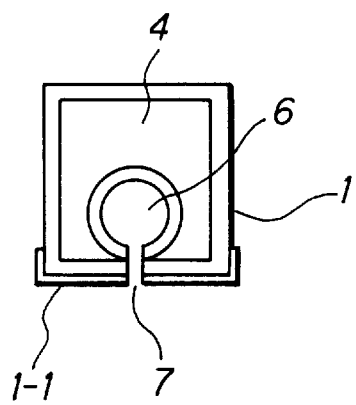
Figure 13C:
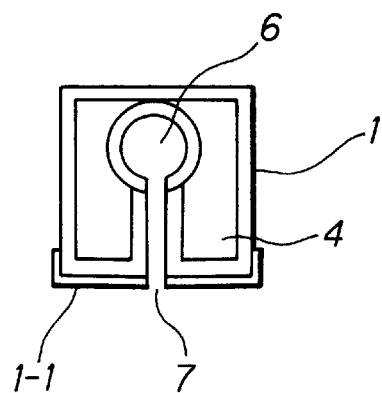
Figure 13D:
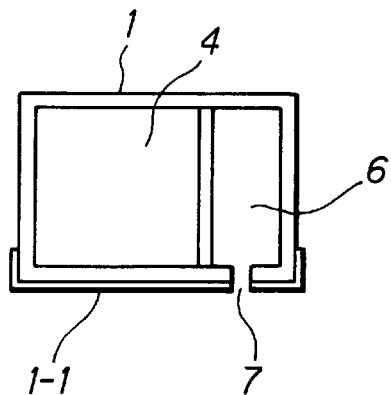
Figure 13E:
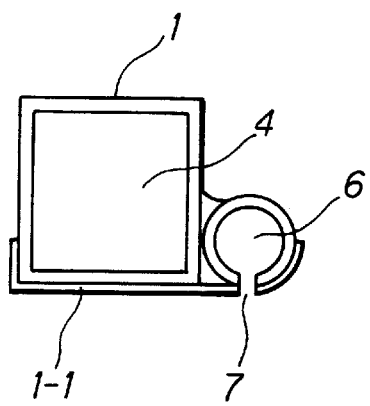
Figure 13F:
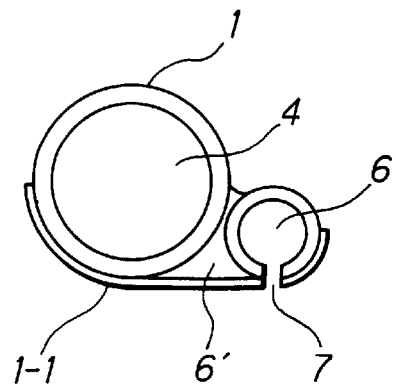
Figure 13G:
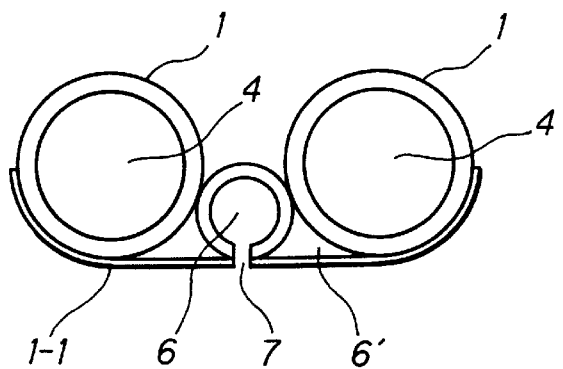
Figure 13H:
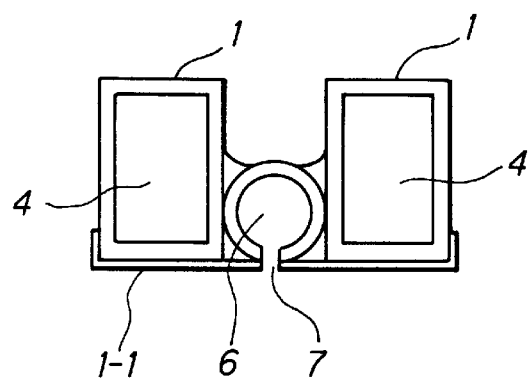
Figure 13I:
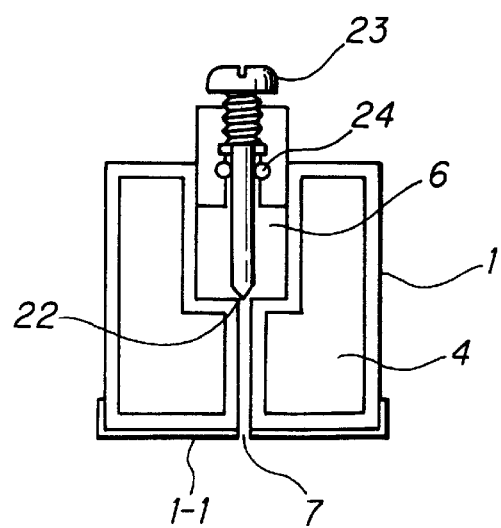
Figure 13J:
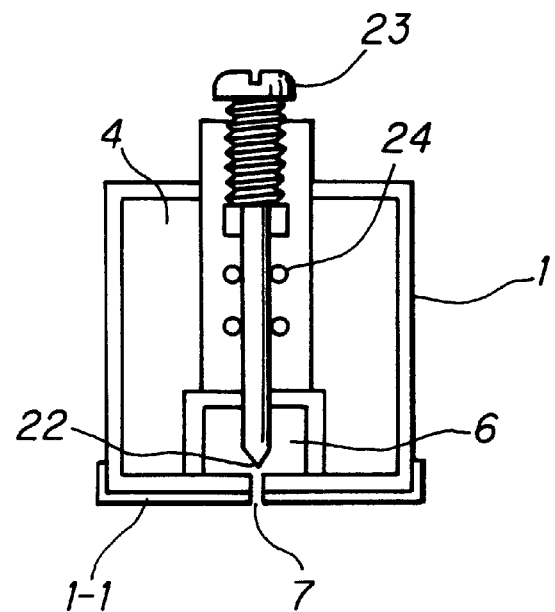
Figure 13K:
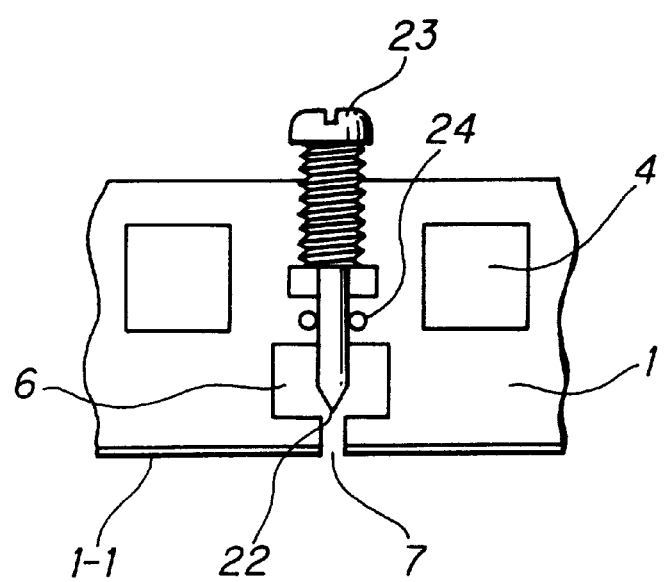
Figure 13L:
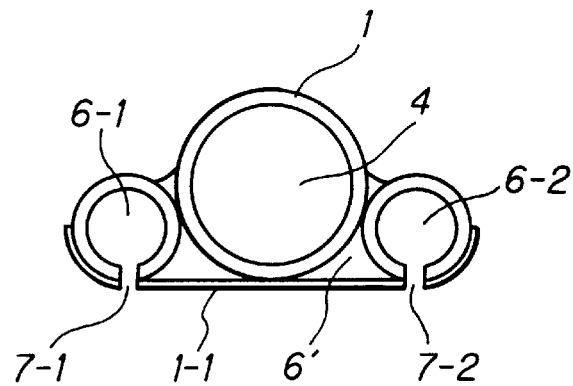
Figure 13M:
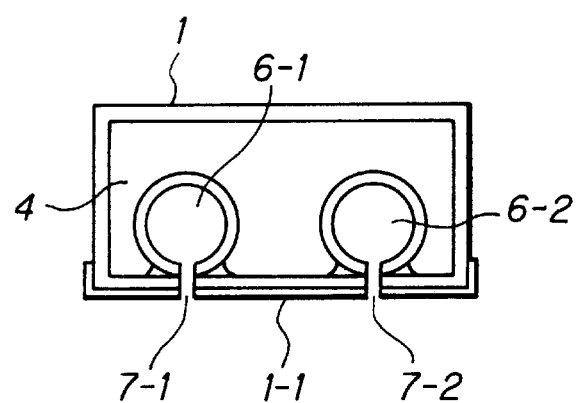

FIG. 13A shows an example applied to a flat-plate-like single-winding coil. FIGS. 13B and 13C show examples in which a gas blowout port is provided so as to be continued from a pipe provided in an angular coil. FIG. 13D shows an example in which a supply gas passage is provided so as to be adjacent to a cooled coil 1. FIGS. 13E and 13F show examples in which a cooled coil and a gas passage are welded to each other. FIGS. 13G and 13H show examples in which a gas passage is provided between cooled coils. FIGS. 13I, 13J and 13K show examples in which an adjustment nozzle 22 is provided for adjusting the flow rate of a gas from a gas blowout port 7. In FIGS. 13I, 13J and 13K, the reference numeral 23 designates a head of a nozzle positioning screw; and 24, a rubber packing or O-ring. FIGS. 13L, 13M and 13N show examples of the structure and arrangement of a high-frequency coil having a plurality of separated supply gas passages.

A third embodiment of the present invention will be described below with reference to FIGS. 14 and 15.

FIG. 14 shows an example of the structure and arrangement of a high-frequency coil having plural kinds of supply gas passages and gas blowout ports thereof. In FIG. 14, the reference numeral 5-1 designates a gas (1) inlet; 5-2, a gas (2) inlet; 6-1, a gas (1) passage; 6-2, a gas (2) passage; 7-1, gas (1) blowout ports; and 7-2, gas (2) blowout ports. This embodiment is applied to the case where two kinds or more of gases are used so as to be independently introduced into a reaction vessel. For example, gases are used as follows.

i) In the case of silicon multilayer epitaxial growth, a silane gas (containing N type or P type impurities) is supplied through one gas passage and an inert gas (hydrogen or nitrogen) or a silane gas (containing impurities different in concentration and type) is supplied through another gas passage so that the residual gas due to the inert gas can be removed rapidly when the growth of each layer is completed or multilayer epitaxial growth can be performed continuously efficiently.

ii) While a silane gas is introduced through one gas passage, an inert gas is sprayed (air curtain) through another gas passage from opposite holes arranged in the outer periphery of the substrate wafer so that the reaction product gas can be ejected out of system rapidly. Furthermore, part of the inert gas is sprayed toward the rear surface of the coil so that gas replacement in the apparatus or going-round of the reaction product gas can be prevented.

iii) In the case of epitaxial growth of a compound semiconductor (for example, a two-element or polyelement compound monocrystal such as gallium arsenide GaAs, gallium arsenide phosphide $GaAs_xP_{1-x}$, etc.), for example, triethylgallium $(C_2H_5)_3Ga$, triethylindium $(C_2H_5)_3In$, arsine $AsH_3$ and phosphine $PH_3$ are used as the raw gas and diethylzinc $(C_2H_5)_2Zn$ (P type) and hydrogen telluride $H_2Te$ (N type) are used as the dopant. When these gases are grouped into a plurality of compositions so as to be supplied through a plurality of blowout ports, and the flow rate of each composition is changed relatively, the composition or conduction type of the crystal in the growth layer can be changed continuously multistageously. Further, the supply gas composition is not fixed but the flow rate (proportion) of each component gas can be changed before the gas is supplied.

iv) In the case of a PSG (Phospho Silicate Glass) film used as an IC protecting film (passivation) or as a layer insulating film, monosilane+phosphine and oxygen which are easy to react with each other are supplied independently and mixed on the substrate surface so that stable film forming can be made.

v) In the case of silane epitaxial growth, there arises many applications and advantages. For example, a raw gas is supplied from one gas supply port and another gas supply port is used as a gas exhaust port so that the apparatus can be used as a continuous film forming apparatus. It is a matter of course that component gases such as silicon, Group III-Group V compounds, Group II-Group VI compounds, various kinds of oxides, etc. can be used as the raw gas.

FIG. 15 shows an example of the structure and arrangement of a high-frequency coil having plural kinds of supply gas passages and gas blowout ports thereof in opposite sides of the high-frequency coil, and an example of the structure and arrangement of an apparatus using a plurality of aforementioned coils. In FIG. 15, the reference numeral 5-1A designates a gas (1) inlet of coil A; 5-2A, a gas (2) inlet of coil A; 5-1B, a gas (1) inlet of coil B; 5-2B, a gas (2) inlet of coil B; 6-1A, a gas (1) passage of coil A; 6-2A, a gas (2) passage of coil A; 6-1B, a gas (1) passage of coil B; 6-2B, a gas (2) passage of coil B; 7-1A, a gas (1) blowout port of coil A; 7-2A, a gas (2) blowout port of coil A; 7-1B, a gas (1) blowout port of coil B; and 7-2B, a gas (2) blowout port of coil B. The reference numeral 10 designates a heat-retaining carbon ring or transparent (quartz, or the like) ring for performing heat retention or gas separation (prevention of turbulence). The reference numeral 12 designates an end of a radiation thermometer or thermo-couple; and 15-3A and 15-3B, insulator disks (quartz, or the like) arranged in the coil A and B sides respectively for preventing the reaction product gas from going round.

FIG. 15 shows the case where the substrate wafer 8 is arranged between two pairs of coils. A component gas as a raw material is introduced through 5-2B of the coil B and sprayed onto the front surface of the substrate through the gas blowout ports 7-2B to perform a reaction. In this occasion, hydrogen or an inert gas is supplied to the rear surface of the substrate through the gas blowout ports 7-1A of the coil A in order to prevent the raw gas and the reaction product gas from going round to the rear surface. Further, if the raw gas is supplied to the rear surface of the substrate through 7-1A, the two surfaces of the substrate can be subjected to epitaxial growth (whether the same kind or different kinds) simultaneously. Further, if two substrates are used in a manner so that they are put back to back, it is possible to carry out epitaxial growth on the front mirror surfaces of the respective substrates. The gas (1) blowout ports 7-1B in the upper side of the coil B and the gas (2) blowout ports 7-2A in the lower side of the coil A serve to supply hydrogen or an inert gas during the reaction to thereby prevent the reaction product gas from going round to the reaction region and discharge the residual gas rapidly. In some condition, the blowout ports 7-1B and 7-2A need not be used but the blowout ports 7-1A and 7-2B may be used selectively. Furthermore, a coil (for example, coil A or coil B) having blowout ports in its opposite sides may be used singly so that epitaxial growth can be performed in the opposite sides (upper and lower) simultaneously.

Although this embodiment has shown the case where two pairs of aforementioned coils are used, double-side epitaxial growth can be performed by supplying a reaction gas from one side or both sides of the opposite gas blowout ports or single-side epitaxial growth can be performed by supplying an inert gas from one side when the aforementioned coils are used multistageously. Although this embodiment has shown the case of a single-winding coil, the same effect as described above is achieved even in the case of a compound-winding plane coil or a flat-plate-like conductor.

Although FIG. 15 has shown the case where two pairs of coils are used, the same effect as described above is achieved even in the case where the coil A is used for heating the substrate (directly or indirectly) and spraying (supplying) an inert gas (inclusive of hydrogen), and the coil terminals 2-2B and 2-1B (not shown, the rear side of 2-2B) of the coil B are short-circuited to form a water-cooled disk having gas blowout ports so that a raw material (containing components and dopants) is supplied through the gas blowout ports 7-2B.

Although this embodiment has shown the case where two pairs of aforementioned coils are used, a method of supplying high-frequency electric power will be described below inclusive of the case where the aforementioned coils are used multistageously. When a single-winding coil is used, it is preferable from the viewpoint of prevention of electric discharge that the electric potential difference between the coil electrode and the substrate wafer is small. Therefor, the coil is generally grounded at the voltage intermediate point. It is further preferable that the gas inlet is provided at the ground point for safety of equipment or work. Although electric power is generally supplied to coils connected in series or parallel, the multistageous coils are complex in structure because the common ground is hardly set in the case of series connection. Accordingly, in the present invention, parallel arrangement is employed and the common ground at the voltage intermediate point of each coil is employed. It is further preferable that electric fields in a coil plane are selected so that the direction (intensity) of the electric fields between coils is intensified.

In FIG. 15, the terminal 2-1A of the coil A and the terminal 2-2B of the coil B are connected to one common terminal and the terminal 2-2A of the coil A and the terminal 2-1B of the coil B are connected to the other common terminal so that high-frequency electric power is supplied to the two common terminals. The currents (directions) flowing in the two coils are reversed to each other but the intensity of high-frequency electric field in the horizontal direction between the two coils is increased. At the same time, the electromagnetic induction repulsion (levitation) effect produced by the coil A to act on the substrate wafer and the electromagnetic induction repulsion effect produced by the coil B are reversed to each other, so that a counter-balance effect is produced. The levitation force and the degree of counter-balance are adjusted on the basis of relative distances between the substrate wafer and the two coils, current values, etc. Also in the case where a large number of substrate wafers are processed simultaneously by using multistages of aforementioned coils, not only the common ground can be set by parallel connection to make it easy to introduce various kinds of gases but also the increase of direction in each coil plane and counter-balance can be made by making the currents reversed in direction to each other.

A fourth embodiment of the present invention will be described with reference to FIG. 16 and FIGS. 17A to 17G. FIG. 16 shows an example of the arrangement of gas blowout ports 7 which are provided in a surface of a flat-plate-like single-winding or compound-winding high-frequency coil so as to be opposite to the substrate wafer 8 as shown in FIGS. 1 to 7, FIGS. 8 to 10 and FIGS. 14 and 15, and an example of gas blowout directions.

The gas blowout ports are generally provided at right angles with respect to the coil surface so that a gas is sprayed substantially perpendicularly to the rotating substrate wafer 8 which is arranged substantially in parallel to the coil surface. In this occasion, however, the supply gas and a gas produced by the reaction may bring turbulence on the substrate surface to cause a tendency to exert influence on the thickness and resistivity distributions. Accordingly, by giving an inclination angle between the gas blowout direction and the substrate wafer surface, gas supply and rapid replacement and discharge of the reaction product gas can be made. Accordingly, improvement of the thickness and resistivity distributions of the growth layer can be attained. In FIG. 16, the arrows given to the gas blowout ports 7 represent the case where a gas is sprayed substantially perpendicularly (that is, tangentially) to the direction of radius of the substrate wafer. tangentially) to the direction of radius of the substrate wafer. Not only the gas blowout direction is selected to be tangential but also the gas blowout direction may be selected to have an inclination angle with respect to the direction (outward direction) of the outer circumference of the substrate wafer. It is a matter of course that the gas blowout direction can be selected freely correspondingly to the blowout position and the purpose thereof. Further, the gas blowout angle may be selected freely in a range of from the angle substantially perpendicular to the coil surface or substrate wafer surface to the angle substantially parallel thereto correspondingly to the purpose, and the gas blowout direction can be selected in a free range with respect to the blowout ports and the center of rotation of the substrate.

Figure 17A:
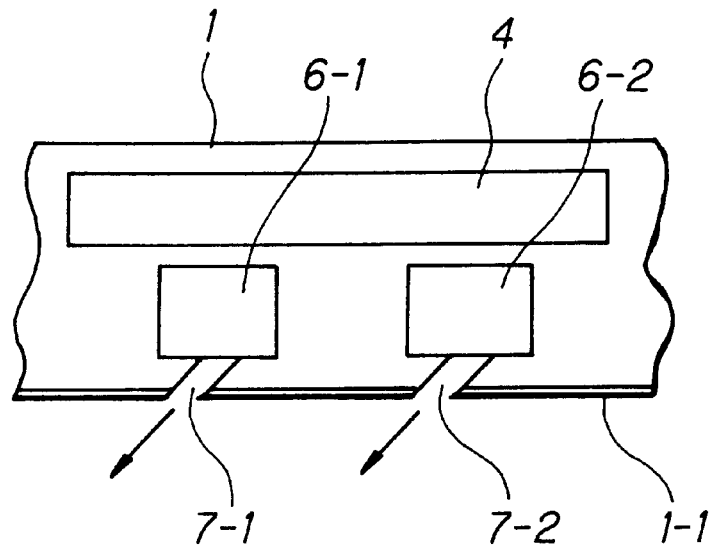
FIGS. 17A to 17G are views showing examples of the structure and arrangement of gas blowout ports and a high-frequency coil for explaining main part of a producing apparatus used in the embodiment of FIG. 16.
Figure 17B:
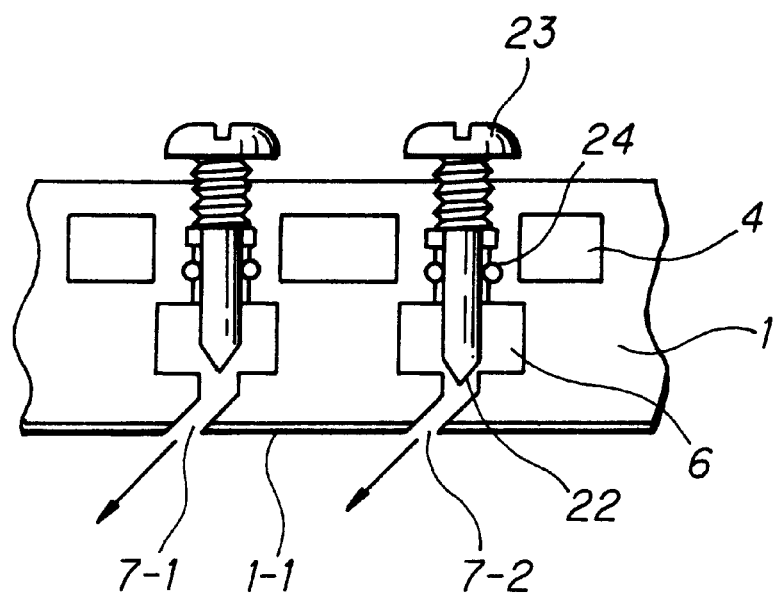
Figure 17C:
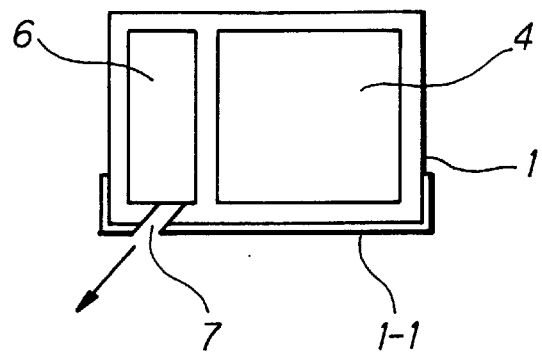
Figure 17D:
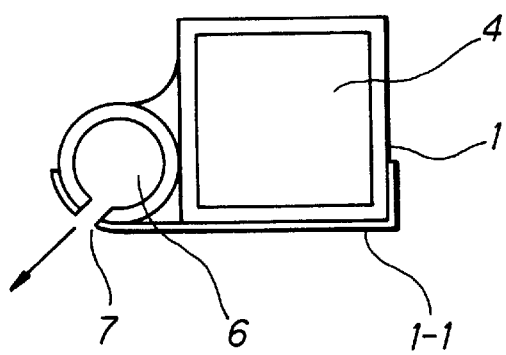
Figure 17E:
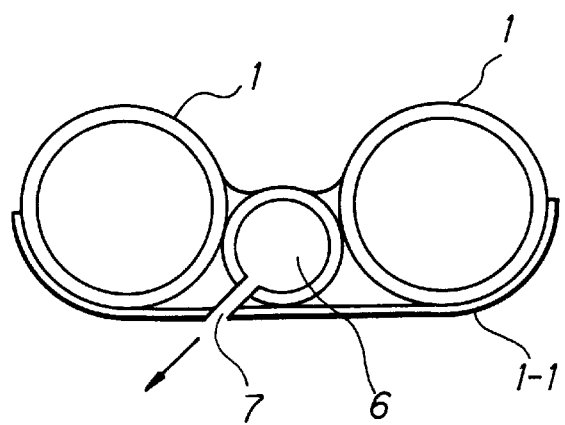
Figure 17F:
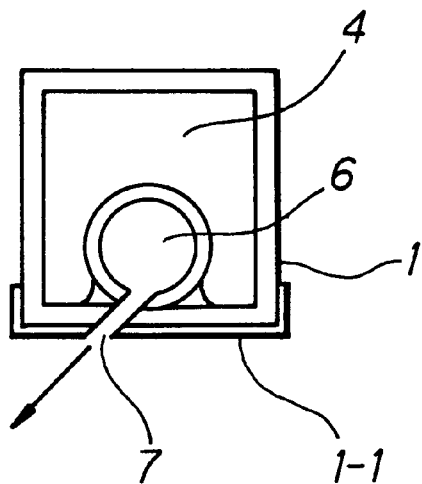
Figure 17G:
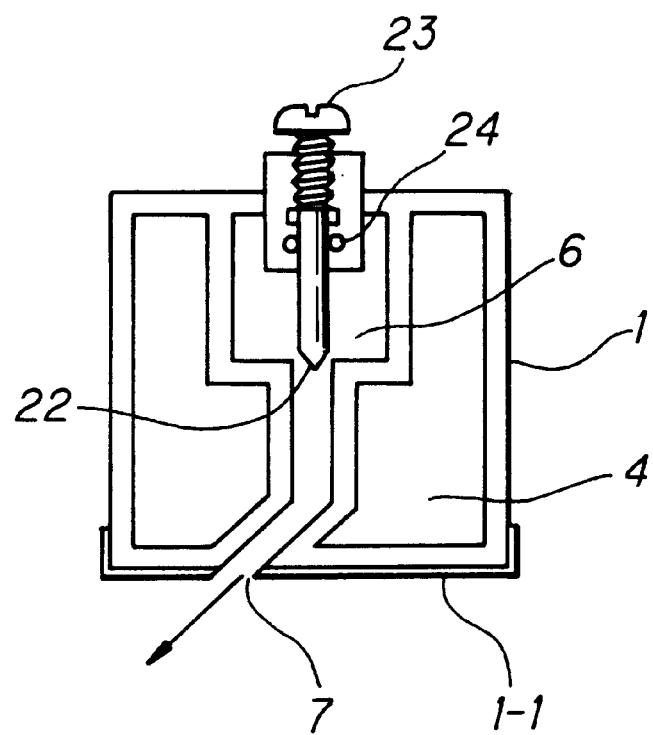

FIGS. 17A to 17G show examples of the structure and arrangement of the gas blowout port and the high-frequency coil used in FIG. 16. Names of parts are common to these drawings and FIGS. 13A–13N. The characteristic of the structure and arrangement of the embodiment is in that a gas is supplied and sprayed with an inclination angle toward the substrate wafer or coil surface through the gas blowout port 7. FIG. 17A shows an example in which plural kinds of gas blowout ports 7-1 and 7-2 are used. FIG. 17B shows an example in which the gas blowout ports 7-1 and 7-2 have gas flow rate fine adjustment nozzles 22, respectively. FIG. 17C shows an example in which a supply gas passage is provided so as to be adjacent to a cooled coil 1. FIG. 17D shows an example in which a cooled coil and a gas passage are welded to each other. FIG. 17E shows an example in which a gas passage is welded between cooled coils. FIG. 17F shows an example in which a gas blowout port is provided so as to be continued from a pipe provided in an angular coil. FIG. 17G shows an example in which a gas flow rate fine adjustment nozzle 22 is provided to adjust the flow rate of a gas from a gas blowout port 7.

As shown in the aforementioned examples, spraying a gas with an inclination angle in the tangential or outer-circumferential direction of the substrate wafer can improve the effective flow rate of the supply gas as well as the rapid replacement of the reaction product gas to thereby improve the speed of crystal growth and the quality of the growth film (evenness in thickness and resistivity and reduction in crystal defects) because the effect of rotation of the substrate wafer is achieved by supplying the supply gas to the substrate wafer surface while rotating. There is further arises an effect in that auto-doping is improved greatly. The aforementioned effects could not be achieved in any epitaxial growth apparatus which was provided conventionally.

A fifth embodiment of the present invention will be described below with reference to FIG. 18. In FIG. 18, a water-cooled high-frequency coil 1 is arranged so that its surface having gas blowout ports faces upward whereas a substrate wafer 8 is arranged so that its surface faces downward so as to be opposite to the gas blowout ports. The reference numeral 25 designates a wafer retainer of quartz shown as an example. The wafer retainer 25 has claws constituted by two arms and capable of supporting the wafer at three points, so that the substrate wafer can be loaded/unloaded to a predetermined position (in this case, nearly center) of the aforementioned coil. As the wafer retainer 25, a Bernoulli retainer may be used. The operation of the retainer in the case where two arms are used will be described. The substrate wafer carried onto the coil by the retainer 25 is floated by lifting power of hydrogen or an inert gas sprayed up from the gas blowout ports provided in the coil surface. In this occasion, the substrate wafer is fixed to a predetermined position by end surfaces (claws) of an upper susceptor 9 so that the substrate wafer is prevented from slipping laterally.

In this period, the retainer 25 passes under the wafer and moves out of the coil. When a current is then made to flow in the high-frequency coil, the substrate wafer is heated by induction current and, at the same time, subjected to lifting power so as to be pressed up by repulsion (levitation effect) based on induction electromagnetic force with respect to the coil current. When the temperature reaches a predetermined value, a raw gas is supplied through the gas blowout ports to perform epitaxial growth. In this period, the substrate wafer is floated in the air by the lifting power of the raw gas and the levitation effect and supported by end portions (claws) of the susceptor so as to be fixed or rotated in a predetermined position (far away by a predetermined distance from the coil). Further, in order to stabilize the substrate supporting position, a coil for spraying an inert gas onto the substrate from the rear side or an auxiliary coil (counter-coil, FIG. 15) can be used.

When the reaction gas is switched over to an inert gas and the high-frequency output is reduced after a predetermined reaction (epitaxial growth) is completed, the levitation effect is eliminated but the substrate wafer is retained in the air without any contact with the coil (metal) by lifting power of the inert gas. In this occasion, the wafer is rapidly cooled by the water-cooled inert gas, that is, the cycle time is shortened. By reducing the gas flow rate, the substrate wafer retained in the air is received softly and carried out of the reaction chamber by the quartz retainer 25 which is constituted by two arms as described above and which has moved under the substrate wafer. Further, by selecting the direction of the gas blowout ports as shown in FIG. 16 in the period of reaction, the substrate wafer can be made to rotate on its own axis. Further, by selecting the direction of the gas blowout ports before and after the reaction, the substrate wafer can be reciprocated in a predetermined direction. Further, by using the Bernoulli retainer, loading/unloading can be made without any contact with the outside jig.

That is, according to the present invention, an excellent effect of cleanness and high producing efficiency which could not be achieved by the conventional apparatus is achieved as follows. Heating and reaction can be performed simultaneously in the state in which the substrate wafer is floated (without any contact) over a cold wall (coil) by using induction electromagnetic repulsion lifting power (levitation effect) and gas pressure lifting power of the reaction gas. Furthermore, rotation, loading and unloading of the substrate wafer can be made easily without any contact.

Further, when the water-cooled high-frequency coil 1 is arranged so that its surface having gas blowout ports faces upward and the substrate wafer 8 is arranged so that its front surface faces downward so as to be opposite to the gas blowout ports as shown in FIG. 18, and when another coil having the same structure as the high-frequency coil 1 is arranged above the substrate wafer so that its surface having blowout ports faces downward so as to be opposite to the surface of the substrate wafer 8, as described about FIG. 15, levitation effect and counter-balance can be attained and, at the same time, the efficiency of high-frequency induction heating can be improved. That is, by arranging two high-frequency coils and a substrate wafer between the two coils so as to be opposite to coil surfaces having gas blowout ports, there can be attained two-fold increase of heating efficiency, prevention of radiation energy loss by using double-side mirror surfaces and retention of stable floating of the substrate wafer. Further, simultaneous growth on opposite surfaces of a substrate, simultaneous growth on respective surfaces of two substrates, and selective ground only on one surface can be effected. With respect to the direction of current, coils can be connected in series or parallel to each other correspondingly to the purpose.

Because a heating reaction is made in the aforementioned floating state, a wide-area substrate wafer is heated to a high temperature easily. For example, in the case of a silicon substrate, it is easy to heat the substrate to a high temperature (1300° C. to 1400° C.) which was conventionally difficult, so that this effect can be used for improving the DZ·IG (Denuted Zone·Intrinsic Gettering) process by hydrogen annealing and for improving crystal defects in an SIMOX (Separation by Ionplanted Oxygen) substrate by high-temperature annealing. Further, annealing or vapor phase growth film growth at about 2000° C., for example, growth of "SiC on C", or the like, may be made in accordance with the material for the substrate wafer.

A sixth embodiment of the present invention will be described below with reference to FIGS. 1 to 7, FIGS. 13A to 13N, FIG. 16 and FIGS. 17A to 17G.

Coil surfaces 1-1 opposite to the substrate wafer and surfaces having gas blowout ports provided in the surfaces 1-1 are all constituted by metals (such as, gold, silver, aluminum, copper, alloys thereof, etc.) having high reflectance with respect to heat radiation (infrared rays) or plated films thereof. The heat of the substrate wafer retained at a high temperature by self-heating is lost from the surface of the substrate wafer mainly by heat radiation, so that not only heat loss arises but also great consumption of electric power arises because the peripheral wall of the apparatus, the high-frequency coil and parts are heated so that a large quantity of cooling water is required. In order to improve this, a metal having high reflectance with respect to infrared radiation (1 $\mu$m to 3 $\mu$m: wavelength) is used as the high-frequency coil nearest to the substrate wafer and opposite to the substrate wafer or as the surface of the high-frequency coil, so that radiated energy is returned to the substrate wafer to thereby make it possible to reduce the heat loss greatly. For example, the electric power required for heating the substrate wafer can be reduced (improved) by a value in a range of from 20% to 30% compared with the conventional method.

Further, the effect is improved more greatly by finishing the high-reflectance metal surface as a mirror surface. The metal reflectance in a wavelength range of from about 1 $\mu$m to about 3 $\mu$m is as follows: gold (96% to 98%), silver (97% to 99%), copper (96% to 97%), aluminum (95% to 98%). It is known that these metals are very effective compared with iron or stainless steel (65% to 70%) generally used in the reaction chamber. Further, by using the mirror surface of a high-reflectance metal as well as the shape of the coil surface, the temperature distribution in the substrate wafer is made uniform and, furthermore, the temperature rising in the coil is suppressed to thereby attain a cooling effect. When a reflection plate 14-1 having a high-reflectance metal mirror surface or a coil surface having gas blowout ports is arranged in the rear surface of the substrate (FIG. 7), the energy saving effect can be improved more greatly. Further, by finishing the coil surface as a mirror surface, deposition of the precipitate and production of fine particles are suppressed, so that a very large effect arises, for example, in that abnormal precipitation on the substrate wafer due to deposition of fine particles or electric discharge between coils and between a coil and the substrate can be prevented.

A seventh embodiment of the present invention will be described below with reference to FIGS. 19, 20 and 21. In the drawings, the reference numeral 26-1 designates an infrared lamp (light source); 26-2, a reflection plate (mirror); and 27, a focal point (plane) of infrared light on the substrate wafer. Light passes through the high-frequency coil surface and is converged at the focal point 27. The reference numeral 28-1 designates lower infrared lamps; 28-2, reflection plates (mirrors); and 28-3, converging lenses. The reference numeral 29 designates a focal point (or plane) of the lamps 28-1, that is, a focal point (or plane) on the rear surface of the substrate wafer via the transparent quartz susceptor or a focal point (or plane) on the rear surface of the carbon susceptor.

In FIG. 20, the reference numeral 30-1 designates an optical path (pipe) constituted by quartz or sapphire and arranged so as to pass through the flat-plate-like single-winding high-frequency coil; 30-2, an end portion of the optical path. The end portion 30-2 is fixed to the neighborhood of the coil surface and shaped like a plane or a spherical surface (lens) which acts so that light fed from the light source 32 and guided by an optical path (fiber) 31 constituted by an optical path pipe or fiber made of quartz or sapphire is converged or dispersively radiated onto the surface of the substrate wafer. Further, the end portion 30-2 is in contact with the coil so as to be cooled. FIG. 21 shows an example applied to a flat-plate-like compound-winding high-frequency coil, an example applied to a plurality of substrate wafers and supports thereof in FIG. 9 and an example in which optical paths 30-1 are arranged in coil gaps in necessary portions opposite to substrates 8. The operation thereof will be described below.

In the present invention, when a substrate wafer of low resistivity (1 Ω·cm to 0.003 Ω·cm) is used, an induction current flows in the wafer easily so that the wafer can be self-heated. In the case of high resistivity (10 Ω·cm to several thousand Ω·cm), an induction current hardly flow in the wafer so that a large time is required for heating. If the wafer is pre-heated by another apparatus, the apparatus becomes complex. Accordingly, it is necessary to heat part or whole of the substrate wafer initially to a temperature in a range of from 400° C. to 600° C. Although initial heating can be generally performed by heat conduction from a heating material when a high-purity carbon susceptor coated with silicon carbide (SiC) or a low resistivity silicon substrate susceptor is used as the substrate wafer support 9, defects such as crystal plane slipping caused by heat distortion, etc. occurs easily in the substrate wafer. Furthermore, because the heat capacity of the susceptor is large compared with the substrate wafer, a large time is required for heating/cooling so that the reaction time (cycle time) becomes long to thereby deteriorate producing efficiency. Furthermore, there arises a defect in that contamination from the carbon susceptor occurs easily. On the contrary, when part or whole of the substrate wafer is initially heated (400° C. to 600° C.) by an infrared lamp so that heat radiation passes through the coil surface, the resistivity of the substrate wafer can be reduced so that induction heating (self-heating) can be performed rapidly. Further, the temperature distribution in the substrate wafer surface can be made uniform in the period of reaction by using the lamp heating auxiliarily.

As shown in FIG. 19, initial heating (pre-heating) can be performed from the substrate support (susceptor) side. In the case of a carbon susceptor, however, a large quantity of electric power and a long time are required because the heat capacity is large so that heating depends on heat conduction. Further, in the case where a transparent material is used as the susceptor, there arises a defect in that scattering of light occurs easily so that the apparatus becomes complex. Accordingly, it is most effective that infrared rays are radiated from the reaction surface of the substrate wafer. In FIG. 19, a iodine-containing infrared lamp or a carbon dioxide gas laser is used as the lamp light source 26. In FIGS. 20 and 21, an infrared lamp or a carbon dioxide gas laser is used as the lamp light source 32 and light energy is supplied from end portions of optical paths 30-2 to the whole surface of the substrate wafer through branch optical paths 31 and the optical paths 30-1. Further, by changing the quantity of light supply through the branch optical paths, the temperature distribution in the substrate wafer surface in the period of reaction is made uniform easily.

An eighth embodiment of the present invention will be described below with reference to FIGS. 20 and 21. In the production of silicon epitaxial growth film or other thin film, there are required the reduction of growth temperature, the improvement of film quality, the improvement of growth speed, the selection of reaction, etc. The present invention provides a method and apparatus for specifically satisfying these requirements. That is, the reaction gas is excited and decomposed on the substrate wafer surface by radiation of light (ultraviolet rays or far-infrared rays) to thereby produce an active intermediate (precursor) such as radical, or the like. While the active intermediate is diffused to the surface of a solid to perform a reaction such as heat decomposition, or the like, the active intermediate is accumulated as a film or the surface movement of absorption active seed on the surface of a solid is accelerated, so that the growth speed of epitaxial growth and crystallinity can be improved.

Further, by selecting the wavelength of radiation light, a specific reaction can be made. In general light CVD (Chemical Vapor Deposition), an excitation light source is set on the substrate wafer. Therefore, the apparatus is large-scaled so that the light loss caused by reflection on the surface of the substrate wafer is large. The object of the present invention is achieved by radiating excitation light onto the substrate wafer through optical paths which are arranged in the substrate wafer so as to pass through the aforementioned high-frequency coil surface. Because the excitation light is enclosed by the high-reflectance coil surface, there arise advantages in that not only the loss caused by reflection can reduced but also the size of the apparatus can be reduced. Further, by using one optical path 30-1 or a plurality of optical paths 30-1, the excitation light can be radiated onto the substrate wafer surface uniformly. Further, because the optical paths and the end portions thereof are cooled through the water-cooled coil, there is little precipitation of the reaction product. Further, the optical paths have characteristic in that electric discharge does not occur at all because the optical paths are electrically insulators.

Although ultraviolet light with a wavelength in a range of from 100 nm to 300 nm is used as a light source, an argon fluoride excimer laser or an argon ion laser may be used as an incoherent light source (mercury lamp, deuterium lamp, xenon lamp, etc.) or a coherent light source (laser) and a pulse carbon dioxide gas laser (infrared light) may be used as a second high-frequency heat excitation light source.

A ninth embodiment of the present invention will be described below with reference to FIGS. 20 and 21. In the production of silicon epitaxial growth film or other thin film, adjustment of the temperature of the substrate wafer is important for the quality of film and the speed of film growth. In a general silicon epitaxial growth apparatus, the temperature of the rear surface of the susceptor or the temperature of a guard ring surrounding the susceptor is indirectly measured by a thermo-couple or radiation thermometer to thereby perform temperature adjustment. The thermo-couple has a tendency to receive high-frequency induction or noise, so that there arises a defect in that reliability is lowered.

In the present invention, because the substrate wafer is heated mainly by self-heating based on induction current, the temperature of the substrate must be directly measured and output adjustment must be made by a feedback circuit to thereby perform temperature adjustment. The temperature of the substrate wafer is changed correspondingly to the high-frequency current, the frequency, the distance between the high-frequency coil and the substrate wafer, the flow rate of the reaction gas, etc. In the aforementioned apparatus of the present invention, the distance between the substrate wafer surface and the high-frequency coil surface is very short, so that it is difficult to observe the surface of the substrate wafer directly. Furthermore, it is difficult to measure the temperature of the substrate wafer directly from the susceptor side (rear side) correspondingly to the material for the susceptor. The present invention provides a method and apparatus for specifically satisfying the requirements. In the present invention, the temperature of the substrate can be adjusted and stabilized as follows: optical paths (sapphire, quartz, etc.) 30-1 are provided so as to pass through the high-frequency coil surface; high-temperature radiation light from the substrate wafer is received by ends 30-2 of the optical paths; the temperature is measured by a detector 32 such as a radiation thermometer, etc. through the optical paths (fiber) 31; and the high-frequency output is adjusted or the distance between the substrate support and the coil is changed by a feedback circuit.

The optical path 30-1, the end 30-2 of the optical path and the optical path (fiber) 31 as described in the seventh, eighth and ninth embodiments of the present invention can be distributed or shared as light energy passages correspondingly to the purpose. The sixth embodiment has been described upon the case where the light source is an infrared light source for pre-heating. The seventh embodiment has been described upon the case where the light source is a ultraviolet light source for exciting the reaction. The eighth embodiment has been described upon the case where the temperature detector 32 is a radiation temperature detector for measuring the temperature. It is, however, a matter of course that the light source and the temperature detector 32 may be used singly or may be used in combination by using a half mirror, a spectrometer, or the like, correspondingly to the purpose in use.

Although the features of the present invention have been described on the basis of some embodiments, the merits of the embodiments are arranged as follows.

According to the first and second embodiments of the present invention, a plane-like high-frequency induction conductor or a plane-like coil constituting plane-like induction electric field and having gas blowout ports at close range is arranged so as to be opposite to the substrate wafer surface to thereby attain the following effects.

(1) Because a limited necessary region is effectively heated by the self-heating of the substrate based on high-frequency induction, there is no outside heat source (heater, complex lamp house, etc.) required. Not only the energy serving effect can be achieved but also rapid uniform heating of the substrate can be made to prevent the occurrence of slipping.

(2) Because a gas (a reaction gas or a raw material gas) is sprayed uniformly onto the substrate at close range, gas replacement on the surface of the substrate is accelerated so that not only the speed of monocrystal or polycrystal growth and the evenness of film are improved but also chemical etching and surface stabilizing (hydrogen annealing, growth of oxide film and nitride film) are performed efficiently. At the same time, because the reaction product gas is rapidly removed from the substrate surface region to the periphery thereof so that the reaction product gas never returns to the substrate surface region, there is prevented contamination caused by the circulating gas and reaction product (particles, heavy metal, etc.) in the apparatus, impurity gas(auto-doping) from the rear surface of the substrate, etc.

(3) The temperature of the substrate can be rapidly cooled from the high temperature at the time of completion of the reaction to room temperature by spraying an inert gas, so that the cycle time can be shortened.

(4) Because a water-cooled high-frequency coil and a gas blowout port or a plurality of gas blowout ports are united into one body (cold wall) so that only the limited necessary region (substrate) is effectively heated without any generation of the reaction product in the outside heat source (high-temperature wall), reduction the size of the apparatus and simplification of the structure of the apparatus can be attained.

Describing particularly silicon monocrystal (epitaxial) growth as specific examples of the effects (1) to (4), a lot of merits become clear as follows.

Rapid uniform heating can be made, so that the occurrence of slipping can be prevented.

The speed of crystal growth is improved.

The occurrence of mound and particles is prevented, so that electric discharge is prevented.

Auto-doping is prevented, so that coating the rear surface with an oxide film is not required.

The evenness of resistivity and thickness of the epitaxial growth layer is improved.

The size of the apparatus is reduced, so that consumed parts are saved.

Uniform epitaxial growth on a large-scale (300 to 400 mm diameter) substrate is easy.

The cycle time is shortened (rapid heating and rapid cooling), so that throughput is improved.

According to the third embodiment of the present invention, by providing plural kinds of gas supply blowout ports, (1) components easy to react to each other are separated and supplied so that growth of a substrate surface protecting film and a layer insulating film can be made; (2) hetero-epitaxial growth using different kinds of raw materials and growth with the continuous multistageous composition change can be made; (3) multilayer epitaxial growth can be made; (4) air curtain can be made; (5) growth of continuous film based on high-speed gas replacement by using one gas blowout port as a gas exhaust port can be made.

According to the fourth embodiment of the present invention, the angle of the gas blowout port is selected so as to be substantially perpendicular to the substrate wafer surface or inclined at an angle (0 to ±90°) with respect to the substrate wafer surface, by which evenness of the supply gas and rapid replacement of the reaction product gas can be made. Further, by providing an inclination angle (0 to ±90°) between the gas blowout port and the direction of radius of the substrate with respect to the center of rotation of the substrate, the reaction gas can be supplied to the substrate wafer while rotating. Accordingly, not only improvement of film growth speed, evenness of the thickness of the growth film and evenness of the resistivity thereof but also great improvement of the quality of the crystal (prevention of auto-doping, mound, deposition of particles, etc.) are attained. That is, the present invention first provides effective rotation supply of the reaction gas in the neighborhood of the surface of the substrate.

According to the fifth embodiment of the present invention, the substrate wafer surface is arranged on the high-frequency coil surface having gas blowout ports so as to be opposite to the gas blowout ports, so that heating of the substrate wafer and a reaction (crystal precipitation, etc.) can be made continuously without any contact while the substrate wafer is floated and retained stably above the coil surface by lifting power based on gas pressure and lifting power based on induction electromagnetic repulsion (levitation). Further, by combining lifting power based on gas pressure and induction electromagnetic repulsion simultaneously or continuously, the movement (loading/unloading) of the substrate wafer, rotation (based on inclination spaying of the supply gas), heating, reaction and cooling can be automatically made over the all steps of crystal growth (reaction) without any contact. Accordingly, high producing efficiency and high quality can be achieved. Further, heating and thin film growth can be made at a high temperature (500° C. to 2000° C.).

According to the sixth embodiment of the present invention, the surfaces of coils and gas blowout ports are constituted by a high reflectance metal (such as gold, silver, etc.) and provided as mirror surfaces to thereby prevent the heat loss from the substrate surface by radiation, so that the effect of saving energy by 20 to 30% is achieved and becomes more useful as the temperature increases. Further, evenness of the temperature distribution in the substrate wafer surface is attained on the basis of the shape of the coil surface opposite to the substrate. Further, because cooling of the coil surface is made sufficiently, there is no high-temperature portion in the wall of the reaction chamber (cold wall) so that precipitation or deposition of the reaction product of the supply gas on the surface can be prevent ed. This effect becomes more great when the surface is finished as a mirror surface.

According to the seventh embodiment of the present invention, an optical path or a plurality of optical paths are provided so as to pass through the high-frequency coil surface, and pre-heating is made by heat radiation (infrared rays) radiated onto the substrate wafer surface through the optical paths to thereby make an induction current flow in the high resistivity substrate wafer (for example, silicon) easily so that the substrate wafer is self-heated easily. Furthermore, evenness of the temperature distribution is attained easily. Although a low resistivity support (susceptor) is generally used for pre-heating, the heat capacity of the susceptor is large so that a large time is required for cooling. Accordingly, by making the induction current flow easily directly, self-heating is accelerated to attain rapid heating (reduction of the cycle time) to thereby improve producing efficiency.

According to the eighth embodiment of the present invention, an optical path or a plurality of optical paths are provided in the substrate wafer surface so as to pass through the high-frequency coil surface and excitation light of ultraviolet rays (wavelength 100 nm to 300 nm) is radiated through the optical paths to thereby attain reduction of the crystal growth temperature (energy saving), improvement of film quality, improvement of crystal growth speed, selection of reactions and reduction of the size of the apparatus.

According to the ninth embodiment of the present invention, an optical path or a plurality of optical paths are provided so as to pass through the high-frequency coil surface having gas blowout ports and the temperature of the substrate surface is measured directly through the optical paths so that the temperature of the substrate surface can be adjusted by adjustment of the high-frequency output. Although the distance between the substrate wafer and the high-frequency coil is short so that the measurement is generally difficult, the present invention makes the measurement possible. The temperature of the substrate wafer and the temperature distribution in the surface can be confirmed through the plurality of optical paths, so that the adjustment thereof is made easy and temperature control programs concerning heating, reaction, cooling, etc. are made easy.

As described above in the seventh, eighth and ninth embodiments of the present invention, the optical paths can be distributed or shared as light energy passages correspondingly to the purpose. In addition, the optical paths (for example, three optical paths) for detecting temperature may be moved up and down so that the optical paths can serve as a substrate wafer support when the substrate wafer is loaded or unloaded.

As described above in detail, according to the present invention, an electrical conductor surface or a coil surface to form a plane-like high-frequency induction region having gas blowout ports is arranged opposite to a surface of a substrate wafer to thereby make it possible to obtain the following effects.

High-speed heating and uniform heating can be performed by self-heating of the substrate wafer, so that the prevention of the occurrence of slipping and the improvement of throughput can be attained.

A raw gas can be supplied from a short distance, so that effective use of the gas as well as the improvement of crystal growth speed and evenness is attained. Further, because rapid replacement of a reaction product gas can be made and there is no return of the reaction product gas, auto-doping can be prevented from occurring, and the particles, contamination, and mound can be prevented from occurring.

The loss of heat caused by radiation is prevented by using a mirror surface made of a high reflectance metal, so that a great energy saving effect can be obtained and the deposition of particles can be prevented.

The reduction in size and the simplification in structure of the apparatus are attained, so that the reduction in cost of the apparatus can be attained.

Epitaxial growth of a large-diameter substrate wafer can be performed easily.

The gas blowout direction can be changed freely, so that the gas supply to the substrate wafer is achieved while the gas rotates. As a result, the evenness and quality of the crystal are improved. Furthermore, the substrate wafer is rapidly cooled from a high temperature by spraying an inert gas after the reaction is perfected, so that the reduction of the reaction cycle time (improvement of throughput) can be attained.

Different kinds of raw gases which are easy to react with each other are supplied by using different gas blowout ports, so that hetero-epitaxial growth, growth of crystals with a continuous composition changing structure and growth of various kinds of oxide thin films can be performed.

Rapid replacement of a gas remaining in the apparatus, simultaneous production of a large number of substrates and reduction in size of the apparatus can be achieved by arranging gas blowout ports in opposite sides.

Further, according to the present invention, a surface of a substrate wafer is arranged opposite to an electrical conductor surface or a coil surface to generate a plane-like high-frequency induction region having gas blowout regions in an upper portion to thereby make it possible to obtain the following effects.

By using electromagnetic induction repulsion (levitation) and floating force of gas blowout simultaneously or alternately, high-temperature heating and crystal growth can be performed in a clean condition while the substrate is kept in a state of non-contact with the substrate support (susceptor), the electrodes, etc.

The substrate wafer can be carried (loaded, unloaded, rotated and moved) in a non-contact state.

Furthermore, according to the present invention, optical paths (pipes) are provided so as to pass through an electric conductor surface or a coil surface to form a plane-like high-frequency induction region having gas blowout ports to thereby make it possible to obtain the following effects.

The high resistivity substrate wafer is pre-heated by radiating infrared rays onto the substrate wafer through the optical paths, so that acceleration of self-heating due to high-frequency induction and evenness of the temperature distribution in the substrate wafer subjected to a reaction can be attained.

Reduction of crystal growth temperature, improvement of crystal growth speed, improvement of crystallinity, and improvement of reaction selection can be attained by radiating ultraviolet rays onto the substrate wafer subjected to a reaction (crystal growth) through the optical paths.

Direct measurement of the temperature of the substrate wafer, measurement of the temperature distribution, temperature control and temperature program control and high-frequency output control can be performed through the optical paths.

What is claimed is:

1. A method of producing a crystal by using of vapor growth process, comprising:

arranging a high-frequency coil or conductor having a surface to generate a plane-like induction electric field and at least one gas blowout port that faces a solid substrate;

inductively heating said solid substrate by said high-frequency coil or conductor;

cooling said high-frequency coil or conductor;

supplying a gas onto a surface of said solid substrate through said at least one gas blowout port; and continuously precipitating and growing a component element or a chemical compound on said surface of said solid substrate at a temperature of not higher than the melting point of said solid substrate, to thereby produce a polycrystal or monocrystal thin film.

2. A method of producing a crystal by using a vapor growth process, comprising:

arranging a high-frequency coil or conductor having a surface to generate a plane-like induction electric field and at least one gas blowout port is that faces a solid substrate;

inductively heating said solid substrate by said high-frequency coil or conductor;

cooling said high-frequency coil or conductor;

supplying a corrosive gas, a reducing gas, an oxidizing gas, or a neutral gas onto a surface of said solid substrate through said at least one gas blowout port; and removing a surface portion of said solid substrate by chemical etching or heat treatment on said solid substrate at a temperature of not higher than the melting point of said solid substrate, to thereby produce a polycrystal or monocrystal substrate.

3. An apparatus for producing a crystal by using a vapor growth process, comprising:

means for retaining a solid substrate;

a high frequency coil or conductor having a surface to generate a plane-like induction electric field and at least one gas blowout port that faces said solid substrate;

means for cooling said high-frequency coil or conductor;

means for inductively heating said solid substrate by said high-frequency coil or conductor; and means for supplying a gas onto a surface of said solid substrate through said gas blowout port to thereby produce a polycrystal or monocrystal thin film.

4. An apparatus for producing a crystal by using a vapor growth process, comprising:

means for retaining a solid substrate;

a high frequency coil or conductor having a surface to generate a plane-like induction electric field and at least one gas blowout port that faces said solid substrate;

means for cooling said high-frequency coil or conductor;

means for inductively heating said solid substrate by said high-frequency coil or conductor; and means for supplying a corrosive gas, a reducing gas, an oxidizing gas or a neutral gas onto a surface of said solid substrate through said gas blowout port to thereby produce a polycrystal or monocrystal substrate.

5. An apparatus for producing a crystal according to claims 3 or 4, wherein the direction of gas blowout of said at least one gas blowout port of said high-frequency coil or conductor is perpendicular to said surface of said solid substrate or has an inclination angle with respect to said surface of said solid substrate.

6. An apparatus for producing a crystal according to claims 3 or 4, wherein said high-frequency coil or conductor is made of gold, silver, copper, aluminum; and wherein said coil or conductor surface where said at least one gas blowout port is formed is a mirror surface.

7. An apparatus for producing a crystal according to claims 3 or 4, wherein said solid substrate is on the surface of said high-frequency coil or conductor having said at least one gas blowout port so that said solid substrate is rotated or moved in a levitated state by said gas blowout and by a levitation force due to a high-frequency induction repulsion by said high-frequency coil or conductor.

8. An apparatus for producing a crystal according to claims 3 or 4, further comprising:

at least one optical path constituted by a hole or a transparent solid material and arranged so as to pierce the surface of said high-frequency coil or conductor, and means for radiating long wavelength light-rays through said optical path to thereby heat said solid substrate.

9. An apparatus for producing a crystal according to claims 3 or 4, further comprising:

at least one optical path constituted by a hole or a transparent solid material and arranged so as to pierce the surface of said high-frequency coil or conductor; and means for radiating short wavelength light-rays through said optical path.

10. An apparatus for producing a crystal according to any one of claims 3 or 4, further comprising: at least one optical path constituted by a hole or a transparent solid material and arranged so as to pierce the surface of said high-frequency coil or conductor; means for detecting the surface temperature of said solid substrate through said optical path to thereby generate a detection output signal; and means for receiving said detection output signal through a feedback circuit and for adjusting an output of a high-frequency electric source to thereby regulate the temperature of said solid substrate.

11. A method of producing a crystal by using of vapor growth process according to claim 1, wherein said at least one blowout port is from 5 to 30 mm from said surface of said substrate.

12. An apparatus for producing a crystal by using a vapor growth process according to claim 3, wherein said at least one blowout port is from 5 to 30 mm from said surface of said substrate.

13. An apparatus for producing a crystal by using a vapor growth process according to claims 3 or 4, wherein said high-frequency coil or conductor further comprises a plating of gold, silver, copper, or aluminum.

14. An apparatus for producing a crystal by using a vapor growth process according to claim 8, wherein said long wavelength light-rays are infrared rays.

15. An apparatus for producing a crystal by using a vapor growth process according to claim 7, wherein said short wavelength light-rays are violet rays.

* * * * *